United States Patent
Yoshizaki

(10) Patent No.: US 7,450,039 B2
(45) Date of Patent: Nov. 11, 2008

(54) TRANSMISSION DEVICE AND ELECTRONIC APPARATUS WITH SELF-DIAGNOSTIC FUNCTION, AND SELF-DIAGNOSTIC METHOD FOR USE THEREIN

(75) Inventor: Shoichi Yoshizaki, Kyoto (JP)

(73) Assignee: Silicon Library Inc., Kanagawa (JP)

( * ) Notice: Subject to any disclaimer, the term of this patent is extended or adjusted under 35 U.S.C. 154(b) by 0 days.

(21) Appl. No.: 11/772,127

(22) Filed: Jun. 30, 2007

(65) Prior Publication Data

US 2008/0122666 A1 May 29, 2008

(30) Foreign Application Priority Data

Jul. 5, 2006 (JP) .............................. 2006-185975

(51) Int. Cl.
*H03M 9/00* (2006.01)

(52) U.S. Cl. ....................................... 341/101; 375/377

(58) Field of Classification Search ................. 341/101; 375/377, 121, 110, 119, 120
See application file for complete search history.

(56) References Cited

U.S. PATENT DOCUMENTS

| 5,268,937 | A | * | 12/1993 | Marbot ........................ 375/377 |
| 5,848,109 | A | | 12/1998 | Marbot et al. |
| 6,914,884 | B2 | | 7/2005 | Matsuo et al. |
| 2003/0091136 | A1 | | 5/2003 | Sugita |
| 2006/0069971 | A1 | | 3/2006 | Waschura et al. |
| 2006/0109895 | A1 | | 5/2006 | Watanabe et al. |

FOREIGN PATENT DOCUMENTS

| JP | 05-225079 | 9/1993 |
| JP | 06-343071 | 12/1994 |
| JP | 08-088624 | 4/1996 |
| JP | 2001-308883 A | 11/2001 |
| JP | 2002-094360 | 3/2002 |
| JP | 2003-218843 A | 7/2003 |
| JP | 2005-005769 | 1/2005 |
| JP | 2006-033075 | 2/2006 |
| JP | 2006-115488 | 4/2006 |
| JP | 2007-096739 | 4/2007 |

OTHER PUBLICATIONS

Notification of Reason(s) for Refusal in JP 2007-171139 dated Apr. 8, 2008, and Translation thereof.

* cited by examiner

*Primary Examiner*—Rexford Barnie
*Assistant Examiner*—Joseph Lauture
(74) *Attorney, Agent, or Firm*—Buchanan Ingersoll & Rooney PC

(57) ABSTRACT

A transmission device includes: parallel/serial conversion units; a clock signal transmission unit; a known-parallel data generation unit for inputting known-parallel data to the parallel/serial conversion units; a clock shift unit for sequentially shifting a clock signal, which is outputted from the clock signal transmission unit, by 1 UI of a data signal; sampling units for sampling data signals obtained by serializing the known-parallel data, in accordance with the clock signal shifted by 1 UI; and a diagnostic processing unit for making a diagnosis as to whether the transmission device is operating normally by comparing sampling results with the known-parallel data, and outputting a result of the diagnosis.

12 Claims, 15 Drawing Sheets

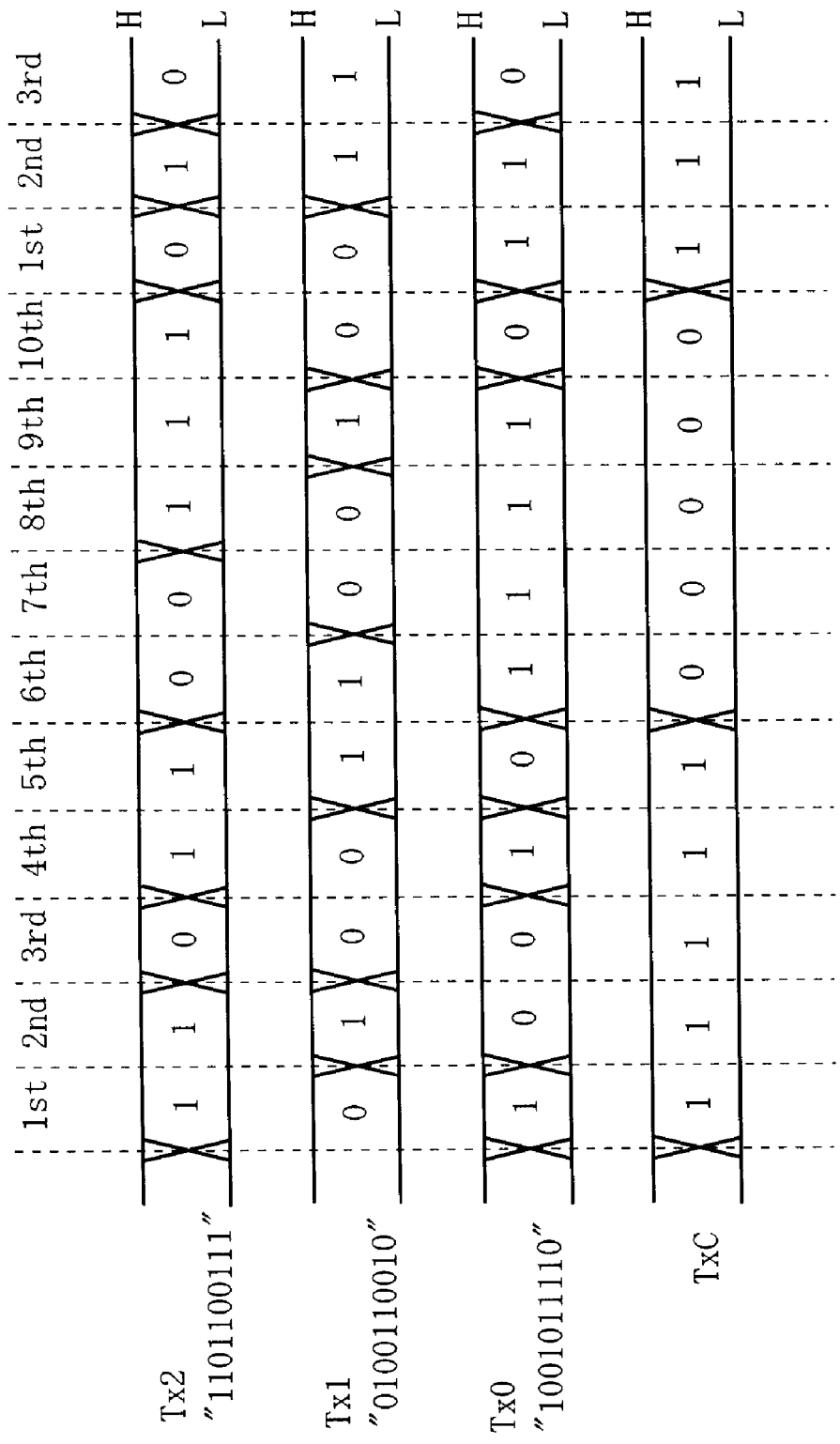

ic apparatus 90 on the transmission side to a reception apparatus 93 on the reception side. In FIG. 13, the electronic apparatus 90 includes a data source 91, and a transmission device 92. Parallel digital data outputted from the data source 91 is inputted to the transmission device 92, and converted into serial digital signals Tx0, Tx1, and Tx2. The transmission device 92 transmits the serial digital signals Tx0, Tx1, and Tx2 to a reception device 94, and also transmits to the reception device 94 a clock signal TxC having the same frequency as that of the parallel digital data outputted from the data source 91. The digital signals Tx0, Tx1, and Tx2 and the clock signal TxC are transferred via dedicated cables 96 to the reception device 94. The reception device 94 reproduces the digital data outputted from the data source 91, in accordance with the digital signals Tx0, Tx1, and Tx2 and the clock signal TxC, and transmits the reproduced data to an output unit 95. The output unit 95 outputs, for example, an image based on the digital data from the reception device 94.

TRANSMISSION DEVICE AND ELECTRONIC APPARATUS WITH SELF-DIAGNOSTIC FUNCTION, AND SELF-DIAGNOSTIC METHOD FOR USE THEREIN

BACKGROUND OF THE INVENTION

1. Field of the Invention

The present invention relates to transmission devices and electronic apparatuses for transmitting data signals and a clock signal, which is used on the reception device side to reproduce the data signals, in one direction to a reception device. More particularly, the present invention relates to a transmission device and an electronic apparatus with a self-diagnostic function for making a diagnosis as to whether the device/apparatus itself is operating normally, and also to a self-diagnostic method for use therein.

2. Description of the Background Art

In recent years, DVI (Digital Visual Interface), HDMI (High Definition Multimedia Interface), and LVDS (Low Voltage Differential Signaling) have been employed as display interface standards. In these standards, the transmission device transmits, to the reception device, data signals and a clock signal in the form of digital signals without any modification. The reception device detects the data signals in accordance with the transmitted clock signal. These standards are used only in one-way communication from the transmission device to the reception device.

FIG. 13 is a block diagram illustrating a general system concept in the case of using the DVI to transmit data from an electronic apparatus 90 on the transmission side to a reception apparatus 93 on the reception side. In FIG. 13, the electronic apparatus 90 includes a data source 91, and a transmission device 92. Parallel digital data outputted from the data source 91 is inputted to the transmission device 92, and converted into serial digital signals Tx0, Tx1, and Tx2. The transmission device 92 transmits the serial digital signals Tx0, Tx1, and Tx2 to a reception device 94, and also transmits to the reception device 94 a clock signal TxC having the same frequency as that of the parallel digital data outputted from the data source 91. The digital signals Tx0, Tx1, and Tx2 and the clock signal TxC are transferred via dedicated cables 96 to the reception device 94. The reception device 94 reproduces the digital data outputted from the data source 91, in accordance with the digital signals Tx0, Tx1, and Tx2 and the clock signal TxC, and transmits the reproduced data to an output unit 95. The output unit 95 outputs, for example, an image based on the digital data from the reception device 94.

FIG. 14 is a block diagram illustrating the functional configuration of the conventional transmission device 92. In FIG. 14, the transmission device 92 includes first through third parallel/serial conversion units 921, 922, and 923, a transmission phase-locked loop circuit (TxPLL) 924, a frequency dividing circuit 925, and a differential output circuit 926.

The TxPLL 924 receives a pixel clock from 25 to 82.5 MHz. The TxPLL 924 decuples the frequency of the pixel clock, and outputs the resultant clock as a clock TxCK. The clock TxCK is inputted to parallel/serial converters (labeled "10to1" in the figure) 921a, 922a, and 923a. Furthermore, the frequency of the clock TxCK is reduced to 1/10 by the frequency dividing circuit 925, and inputted to the differential output circuit 926. The differential output circuit 926 converts the inputted signal into a differential signal, which is outputted as a differential clock signal TxC.

The first through third parallel/serial conversion units 921, 922, and 923 each receive transmission data, which is 10-bit parallel digital data. The frequency of the parallel digital data is the same as that of the pixel clock. The parallel/serial converters 921a, 922a, and 923a are serializers for converting parallel data into serial data. The parallel/serial converters 921a, 922a, and 923a convert the transmission data, which is 10-bit parallel data, into serial data in accordance with the clock TxCK, which is a tenfold clock inputted from the PLL circuit 924, and output the serial data. The serial data outputted from the parallel/serial converters 921a, 922a, and 923a is inputted to differential output circuits 921b, 922b, and 923b, respectively. The differential output circuits 921b, 922b, and 923b convert the inputted serial data into a differential data signal, and output the differential data signals Tx0, Tx1, and Tx2, respectively.

In this manner, the clock signal TxC and the data signals Tx0, Tx1, and Tx2 are outputted from the transmission device 92, and respectively transferred via cables 930, 927, 928, and 929 matched with 50 ohms to the reception device side. Note that the difference in potential between the differential signals is assumed here to be 3.3 V, but it may be higher or lower.

FIG. 15 is a diagram illustrating examples of the data signals Tx0, Tx1, and Tx2 and the clock signal TxC outputted from the transmission device 92. The data signals and the clock signal are differential signals, and therefore they are transferred while being inverted between high (H) and low (L) levels. In the examples shown in FIG. 15, when the data transitions from "1" to "0", H is inverted to L. As shown in FIG. 15, the data signals Tx0, Tx1, and Tx2 are transferred in synchronization with the clock signal TxC.

As described above, in the DVI standard and suchlike, the data signals and the clock signal are transferred in one direction from the transmission side to the reception side. Note that in the DVI, the data signals Tx0, Tx1, and Tx2 are each assigned an RGB value. Note that the DVI is described in, for example, Japanese Laid-Open Patent Publication No. 2003-218843.

In the above standards, the digital data is transmitted at extremely high speed, and therefore the data cannot be reproduced on the reception side unless the transmission device 92 operates normally. Therefore, it is necessary to diagnose with high accuracy whether the transmission device 92 is normally operating.

Conventionally, in order to diagnose whether the transmission device 92 is operating normally, the following methods have been generally employed. Specifically, a tester (not shown) is provided on the output side of the transmission device 92, and the transmission device 92 is caused to transmit known data, so that the tester can diagnose whether the transmission device 92 is operating normally, based on whether the tester can receive the known data normally. If the data received by the tester is different from the transmitted data, the transmission device 92 can be diagnosed as malfunctioning.

In the above standards, however, the transmission data is transferred at extremely high speed, and therefore the diagnostic tester is also required to operate at high speed. Incorporating functions for allowing the tester to operate at high speed and with high accuracy makes the tester extremely expensive.

Note that as for communication control circuits in conformity with the IEEE 1394 standard, an invention that allows the communication control circuits to make a self-diagnosis without using the tester has been disclosed (see Japanese Laid-Open Patent Publication No. 2001-308883), but no invention has been disclosed regarding self-diagnosis according to the standards, such as DVI, HDMI and LVDS, in which the data signals and the clock signal are transmitted in one direction from the transmission device to the reception device.

SUMMARY OF THE INVENTION

Therefore, the present invention aims to provide a transmission device and an electronic apparatus that are capable of making a diagnosis of their own performance without using any expensive tester, according to a communication standard for transmitting data signals and a clock signal in one direction to a reception device, and the present invention also aims to provide a self-diagnostic method for use in the same transmission device and electronic apparatus.

The present invention has the following features to solve the problems mentioned above. One aspect of the present invention is directed to a transmission device for transmitting data signals and a clock signal in one direction to a reception device, the clock signal being used for reproducing the data signals on the reception device side, the transmission device including: one or more parallel/serial conversion units for converting one or more pieces of n-bit parallel data, where n is an integer of two or more, into one or more pieces of serial data, and transmitting the one or more pieces of serial data to the reception device as one or more data signals; a clock signal transmission unit for transmitting the clock signal to the reception device; a known-parallel data generation unit for generating known n-bit parallel data as known parallel data when the transmission device makes a self-diagnosis as to whether the transmission device is operating normally, and inputting the generated known parallel data into the one or more parallel/serial conversion units; a shift unit for, when the transmission device makes the self-diagnosis, sequentially shifting a temporal difference between the clock signal and a data signal by 1 UI of the data signal, the data signal being obtained by serializing the known parallel data; one or more sampling units for, when the transmission device makes the self-diagnosis, sampling the data signals obtained by serializing the known parallel data, in accordance with the clock signal temporally different from the data signal; and a diagnostic processing unit for making a diagnosis as to whether the transmission device is operating normally by comparing sampling results obtained by the one or more sampling units with the known parallel data generated by the known-parallel data generation unit, and outputting a result of the diagnosis.

In the present invention, one bit is sampled from each data signal obtained by serializing the known parallel data, in accordance with the clock signal, and therefore the transmission device can make a self-diagnosis as to whether the transmission device is operating normally by comparing the sampling results with one bit in the known parallel data. Thus, it is possible to provide a transmission device capable of making a diagnosis of its own performance without using any expensive tester, according to a communication standard for transmitting data signals and a clock signal in one direction to a reception device.

Preferably, the shift unit may be a clock shift unit for sequentially shifting the clock signal by 1 UI of the data signal, and the one or more sampling units may sample the data signal obtained by serializing the known parallel data, in accordance with the clock signal shifted by 1 UI by the clock shift unit.

Thus, one bit is sampled from each data signal obtained by serializing the known parallel data, in accordance with the clock signal, and therefore the transmission device can make a self-diagnosis as to whether the transmission device is operating normally by comparing the sampling results with one bit in the known parallel data.

Preferably, the clock signal transmission unit may include: a clock signal generation serializer for generating the clock signal by converting n-bit clock parallel data into serial data, the n-bit clock parallel data having the same frequency as that of the n-bit parallel data and transitioning from a high/low level to a low/high level after half the number of bits; and a transmission unit for transmitting the clock signal generated by the clock signal generation serializer to the reception device, and the clock shift unit may sequentially input n-bit diagnostic parallel data to the clock signal generation serializer, thereby sequentially shifting the clock signal outputted from the clock signal transmission unit by 1 UI of the data signal, the n-bit diagnostic parallel data being used for causing the clock signal generation serializer to output n-bit serial data while shifting its rising edge or falling edge by one bit.

Thus, by merely inputting predetermine patterned diagnostic parallel data to the clock signal generation serializer, it becomes possible to shift the clock signal by 1 UI, making it possible to provide a transmission device capable of making a self-diagnosis in an extremely simple manner.

Preferably, the clock signal transmission unit may include: a PLL circuit for generating the clock signal; and a transmission unit for transmitting the clock signal generated by the PLL circuit to the reception device, and the clock shift unit may sequentially delay the clock signal generated by the PLL circuit by 1 UI of the data signal.

Thus, it is possible to shift the clock signal by 1 UI, making it possible to provide a transmission device capable of making a self-diagnosis in an extremely simple manner.

Preferably, the clock shift unit may cause the clock signal transmission unit to continuously or gradually shift a rising edge or falling edge of the clock signal by a predetermined period, the one or more sampling units may sample the data signal each time the clock signal is shifted; and the diagnostic processing unit may measure jitter by comparing sampling results obtained by the one or more sampling units with the known parallel data generated by the known-parallel data generation unit.

Thus, the transmission device itself can measure jitter within a predetermined period of the data signal, e.g., a period in which the data signal rises or falls.

The diagnostic processing unit may determine the transmission device as malfunctioning, for example, when the jitter does not meet a predetermined requirement.

Thus, it is possible to achieve a self-diagnosis with high accuracy based on measured jitter.

For example, the transmission device may further include an activation control unit for controlling activation of the known-parallel data generation unit, the shift unit, the one or more sampling units, and the diagnostic processing unit.

Thus, it is possible to cause the activation control unit to totally control the self-diagnostic function, making it possible to readily make a self-diagnosis. Particularly, even if the transmission device is incorporated in an electronic apparatus, the self-diagnosis can be readily performed.

Preferably, the clock shift unit may cause the clock signal transmission unit to sequentially shift the clock signal by 1 UI, such that a rising edge or falling edge of the clock signal is shifted by ½ UI with respect to a rising edge or falling edge of the data signal.

Thus, it becomes possible to perform sampling with the data signals being stabilized, making it possible to enhance the accuracy of the self-diagnosis.

Preferably, the clock shift unit may sequentially delay the clock signal to sequentially shift the clock signal by 1 UI.

Thus, it becomes possible to shift the clock signal by 1 UI, making it possible to provide a transmission device capable of making a self-diagnosis in a simple manner.

Preferably, the shift unit may be a data signal shift unit for sequentially shifting the data signal obtained by serializing the known parallel data, by 1 UI of the data signal, and the one or more sampling units may sample the data signal shifted by 1 UI by the data signal shift unit, in accordance with the clock signal.

Thus, it becomes possible to provide a transmission device capable of making a self-diagnosis not only by shifting the clock signal by 1 UI, but also by shifting the data signal by 1 UI.

Another aspect of the present invention is directed to an electronic apparatus for transmitting data signals and a clock signal in one direction to a reception apparatus, thereby causing the reception apparatus to operate, the clock signal being used for reproducing the data signals on the reception apparatus side, the electronic apparatus including: one or more parallel/serial conversion units for converting one or more pieces of n-bit parallel data, where n is an integer of two or more, into one or more pieces of serial data, and transmitting the one or more pieces of serial data to the reception apparatus as one or more data signals; a clock signal transmission unit for transmitting the clock signal to the reception apparatus; a known-parallel data generation unit for generating known n-bit parallel data as known parallel data when the electronic apparatus makes a self-diagnosis as to whether the electronic apparatus is operating normally, and inputting the generated known parallel data into the one or more parallel/serial conversion units; a shift unit for, when the electronic apparatus makes the self-diagnosis, sequentially shifting a temporal difference between the clock signal and a data signal by 1 UI of the data signal, the data signal being obtained by serializing the known parallel data; one or more sampling units for, when the electronic apparatus makes the self-diagnosis, sampling the data signal obtained by serializing the known parallel data, in accordance with the clock signal temporally different from the data signal; and a diagnostic processing unit for making a diagnosis as to whether the electronic apparatus is operating normally by comparing sampling results obtained by the one or more sampling units with the known parallel data generated by the known-parallel data generation unit, and outputting a result of the diagnosis.

Still another aspect of the present invention is directed to a method for allowing a transmission device to make a self-diagnosis as to whether the transmission device is operating normally, the transmission device transmitting data signals and a clock signal in one direction to a reception device, the clock signal being used for reproducing the data signals on the reception device side, wherein the transmission device includes: one or more parallel/serial conversion units for converting one or more pieces of n-bit parallel data, where n is an integer of two or more, into one or more pieces of serial data, and transmitting the one or more pieces of serial data to the reception device as one or more data signals; and a clock signal transmission unit for transmitting the clock signal to the reception device, and wherein the method includes the steps of: generating known n-bit parallel data as known parallel data, and inputting the generated known parallel data into the one or more parallel/serial conversion units; sequentially shifting a temporal difference between the clock signal and a data signal by 1 UI of the data signal, the data signal being obtained by serializing the known parallel data; sampling the data signal obtained by serializing the known parallel data, in accordance with the clock signal temporally different from the data signal; and making a diagnosis as to whether the transmission device is operating normally by comparing sampling results with the known parallel data.

Thus, the present invention makes it possible to provide a transmission device and an electronic apparatus that are capable of making a diagnosis of their own performance without using any expensive tester, according to a communication standard for transmitting data signals and a clock signal in one direction to a reception device. In addition, it is possible to provide a self-diagnostic method for use in the same transmission device and electronic apparatus.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a diagram illustrating examples of data signals Tx0, Tx1, and Tx2 and a clock signal TxC, which are outputted from the transmission device 92.

DESCRIPTION OF THE PREFERRED EMBODIMENTS

Hereinafter, embodiments of the present invention will be described with reference to the drawings. Note that as for the relationship between the transmission side and the reception side, the same system concept as that described in the "Description of Background Art" section is applied, and FIG.

Figure 13:
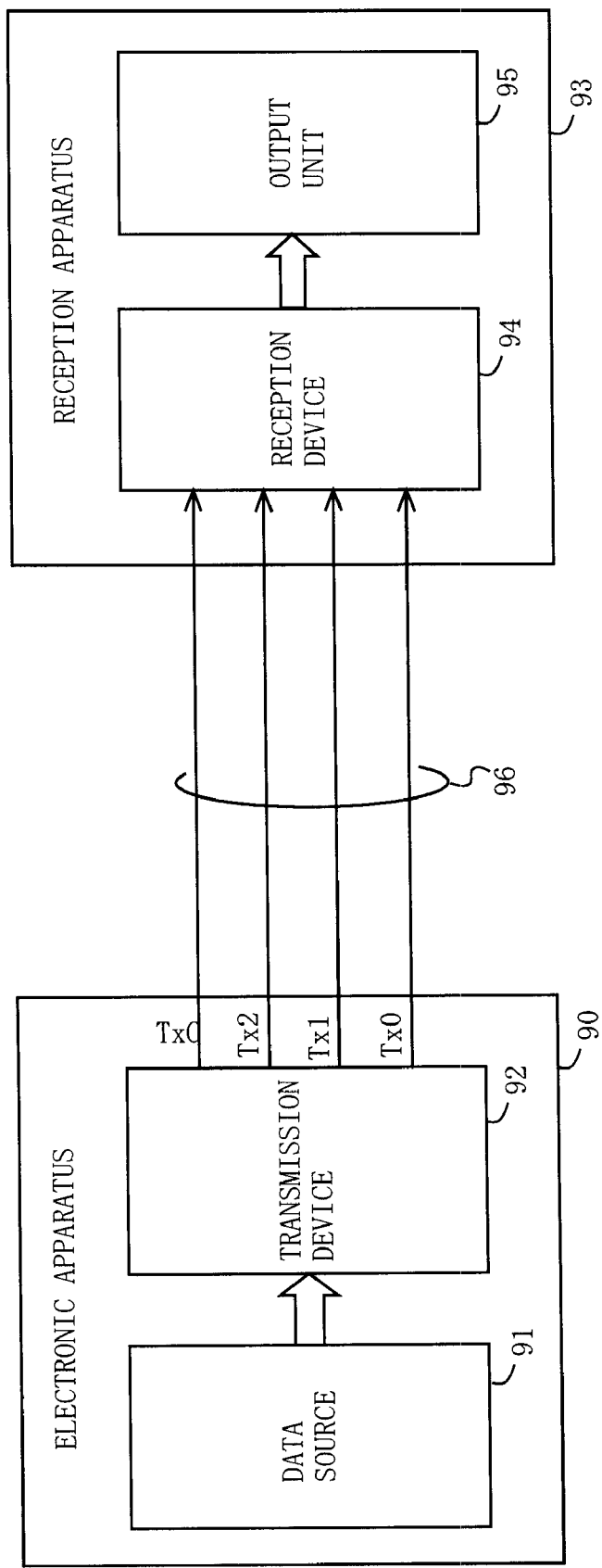
FIG. 13 is a block diagram illustrating a general system concept in the case of using the DVI to transmit data from an electronic apparatus 90 on the transmission side to a reception apparatus 93 on the reception side.
Figure 14:
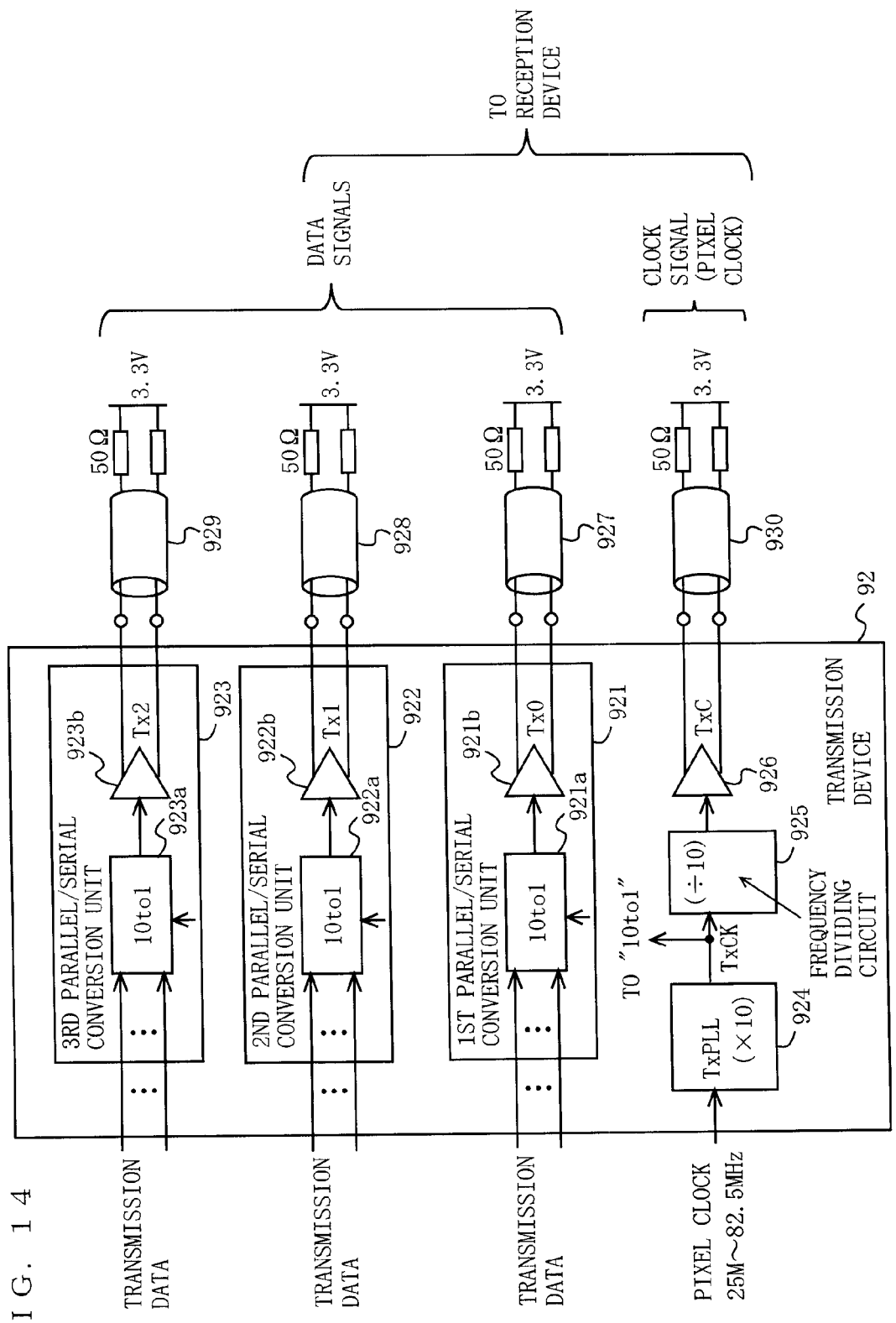
FIG. 14 is a block diagram illustrating the functional configuration of a conventional transmission device 92.

13 is referenced as an example. However, the present invention is applicable to any standards in which the data signals and the clock signal that is used on the reception device side in order to reproduce the data signals are transmitted in one direction from the transmission device to the reception device, and therefore the present invention is not limited to the system concept as shown in FIG. 13. Specifically, the data signals used in the present invention are not limited to the three signals Tx0, Tx1, and Tx2, and it is assumed that one or more data signals are transmitted in one direction from the transmission device to the reception device. In the case where the number of data signals is not three, the number of components required in the transmission device as described below naturally varies, and in such a case, additional descriptions will be given as necessary. However, for ease of explanation, the following description will be given basically with respect to the case where the number of data signals is three.

First Embodiment

Figure 1:
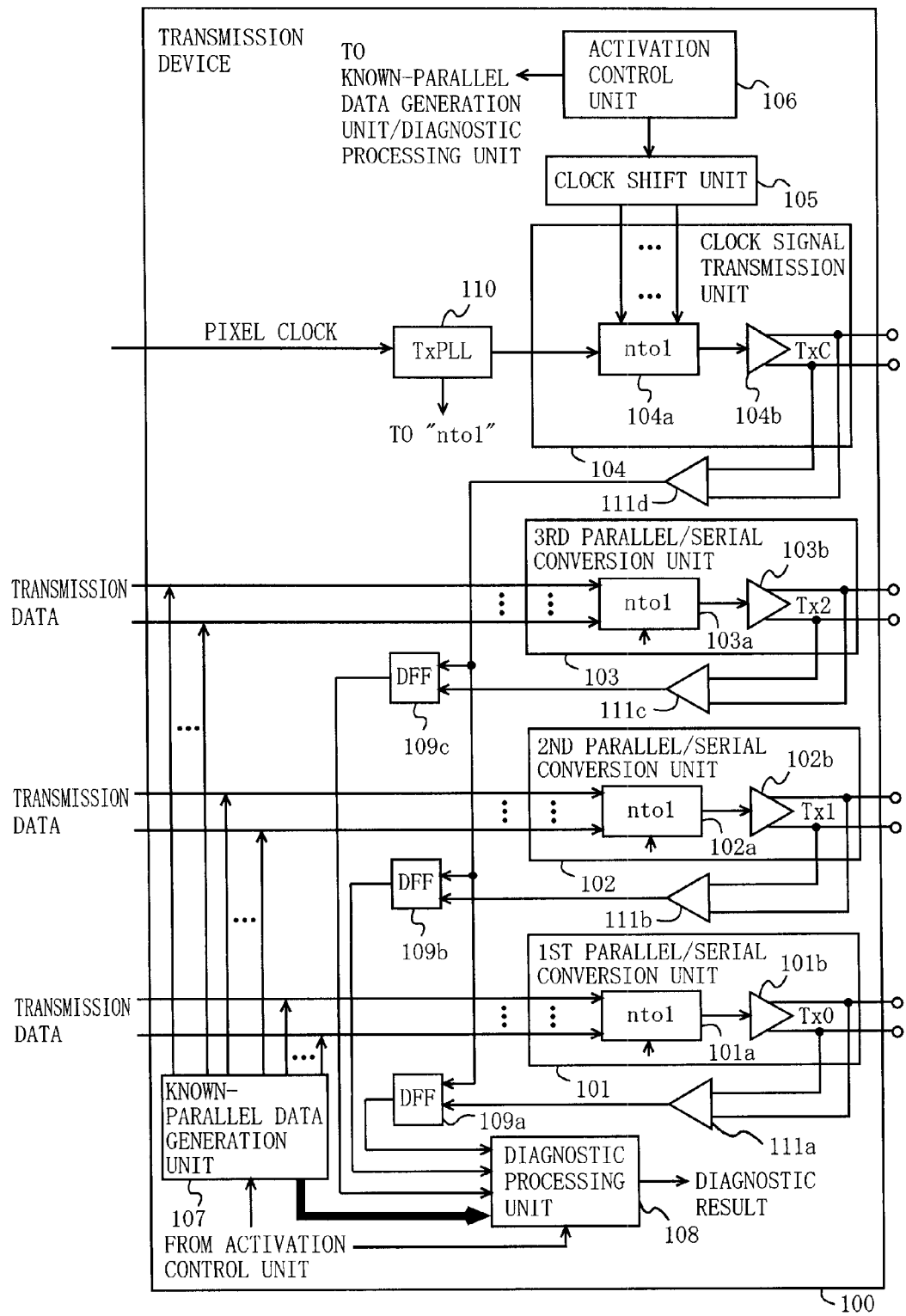
FIG. 1 is a block diagram illustrating the functional configuration of a transmission device 100 according to a first embodiment of the present invention.

FIG. 1 is a block diagram illustrating the functional configuration of a transmission device 100 according to a first embodiment of the present invention. In FIG. 1, the transmission device 100 includes first through third parallel/serial conversion units 101, 102, and 103, a clock signal transmission unit 104, a clock shift unit 105, an activation control unit 106, a known-parallel data generation unit 107, a diagnostic processing unit 108, delay flip-flops (DFFs) 109a, 109b, and 109c, a transmission phase-locked loop circuit (TxPLL) 110, and receivers 111a, 111b, 111c, and 111d. The first parallel/serial conversion unit 101 includes a parallel/serial converter (labeled "nto1" in the figure) (like elements are labeled similarly)) 101a, and a differential output circuit 101b. The second parallel/serial conversion unit 102 includes a parallel/serial converter 102a, and a differential output circuit 102b. The third parallel/serial conversion unit 103 includes a parallel/serial converter 103a, and a differential output circuit 103b. The clock signal transmission unit 104 includes a clock signal generation serializer (labeled "nto1" in the figure) 104a, and a differential output circuit 104b. Note that when the number of data signals is m, the number of parallel/serial conversion units is m (i.e., the first through m'th parallel/serial conversion units are provided), and the number of corresponding components is also m (i.e., m DFFs and m receivers are provided).

Described first is the operation in the case where the transmission device 100 does not make a self-diagnosis, i.e., the data signals and the clock signal are transmitted in one direction to the reception device side as per normal.

The TxPLL 110 increases the frequency of a pixel clock n-fold, and inputs the resultant clock to the parallel/serial converters 101a, 102a, and 103a and the clock signal generation serializer 104a. The transmission data inputted to the first through third parallel/serial conversion units 101, 102, and 103 is n-bit parallel data (where n is an integer of 2 or more; in the case of the DVI standard, n=10). Note that the frequency of the transmission data is the same as that of the pixel clock, but this is not restrictive.

The parallel/serial conversion unit 101a converts the inputted transmission data, which is n-bit parallel data, into serial data having n times the frequency of the transmission data, in accordance with the n-fold pixel clock from the TxPLL 110, and the resultant serial data is inputted to the differential output circuit 101b. The differential output circuit 101b converts the inputted serial data into a differential signal, and outputs it as a data signal Tx0. Similarly, the second parallel/serial conversion unit 102 outputs a data signal Tx1. The third parallel/serial conversion unit 103 outputs a data signal Tx2.

When no self-diagnosis is performed, the clock shift unit 105 inputs n-bit clock parallel data to the clock signal generation serializer 104a of the clock signal transmission unit 104, so as to synchronize with the transmission data. The clock parallel data refers to data that is patterned as described below. For example, when n=10, the clock parallel data is "1111100000". Specifically, when n is an even number, the clock parallel data is n-bit parallel data that transitions from high (H) to low (L) after half the number of bits, i.e., n/2 bits. If n is an odd number, the clock parallel data is n-bit parallel data that transitions from H to L after half the number of bits, i.e., (n+1)/2 or (n−1)/2 bits. Note that the direction of the transition may be from L to H.

The clock signal generation serializer 104a converts the inputted n-bit clock parallel data into serial data having an n-fold frequency, in accordance with the n-fold pixel clock from the TxPLL 110, and inputs the resultant data to the differential output circuit 104b. The differential output circuit 104b converts the inputted serial data into a differential signal, and outputs it as a clock signal TxC. The serial data maintains H level up to half the number of bits, so that the clock signal transmission unit 104 outputs a clock signal TxC having the same frequency as that of the pixel clock, i.e., the same frequency as that of the transmission data, which is n-bit parallel data. The differential output circuit 104b functions as a transmission unit for transmitting the clock signal to the reception device. Note that for ease of explanation, the frequency of the clock signal TxC has been described as having the same frequency as that of the transmission data, but this is not restrictive and the clock signal can have any frequency so long as the data signals can be reproduced on the reception device side.

In this manner, when no self-diagnosis is performed, the transmission device 100 transmits the data signals and the clock signal, which is used to reproduce the data signals on the reception device side, in one direction to the reception device.

Described next is the operation in the case where the transmission device 100 diagnoses whether the transmission device itself is operating normally. Note that the timing of self-diagnosis may be before or after the transmission device 100 is incorporated into a part of an electronic apparatus. In the case of performing the self-diagnosis before the incorporation, the activation control unit 106 may be disposed outside the transmission device 100. Alternatively, in the case of performing the self-diagnosis after the incorporation, the activation control unit 106 may be preferably disposed inside the transmission device 100, but this is not restrictive.

When the self-diagnosis is performed, the activation control unit 106 activates and synchronizes each of the following components: the known-parallel data generation unit 107; the clock shift unit 105; the DFFs 109a, 109b, and 109c; the receivers 111a, 111b, 111c, and 111d; and the diagnostic processing unit 108.

As known parallel data, the known-parallel data generation unit 107 inputs known n-bit parallel data to the first through third parallel/serial conversion units 101, 102, and 103, and the diagnostic processing unit 108.

The clock shift unit 105 inputs n-bit diagnostic parallel data to the clock signal generation serializer 104a in order to cause the clock signal outputted from the clock signal transmission unit 104 to be sequentially shifted by one unit interval (UI) of the data signal. Specifically, the clock shift unit 105 outputs the diagnostic parallel data, such that the rising edge (or falling edge) of the n-bit serial data outputted from the clock signal generation serializer 104a is shifted by one bit. Note that a concrete example of the diagnostic parallel data will be described later.

The known parallel data outputted from the known-parallel data generation unit 107 is converted into serial data having an n-fold frequency in each of the first through third parallel/serial conversion units 101, 102, and 103, to produce data signals Tx0, Tx1, and Tx2. The receivers 111a, 111b, and 111c respectively convert the data signals Tx0, Tx1, and Tx2 into single-phase signals, which are inputted to the DFFs 109a, 109b, and 109c, respectively. At the same time, the clock signal TxC outputted from the clock signal transmission unit 104 is converted into a single-phase signal by the receiver 111d. The clock signal TxC converted into the single-phase signal is inputted to the DFFs 109a, 109b, and 109c.

Each of the DFFs 109a, 109b, and 109c samples whether the serialized data signal is at "H" or "L" level at the rising edge (or falling edge) of the inputted clock signal TxC, and inputs a sampling result to the diagnostic processing unit 108. Note that if the sampling is possible at the rising edge (or falling edge) of the clock signal TxC, the DFFs 109a, 109b, 109c may be replaced by other sampling units.

The diagnostic processing unit 108 compares the sampling results inputted from the DFFs 109a, 109b, and 109c with the value of the known parallel data at the rising edge (or falling edge) of the clock signal TxC, and stores comparison results regarding consistency.

Thereafter, the clock shift unit 105 shifts the clock signal TxC by 1 UI at least the number of times corresponding to n bits, and comparison results for the n-bit known parallel data are accumulated in the diagnostic processing unit 108. Therefore, the diagnostic processing unit 108 outputs the diagnostic results regarding whether the transmission device is operating normally based on the accumulated comparison results, in accordance with a predetermined condition. For example, the predetermined condition is that "if any of the obtained sampling results mismatches the known parallel data, even by one bit, the device is diagnosed as malfunctioning". Note that the details of the predetermined condition are determined according to the standard, and therefore do not limit the present invention.

Note that the diagnostic processing unit 108 has been described herein as obtaining comparison results for at least n bits, but there is a possibility that the transmission device 100 might happen to be operating normally, and therefore the comparison results for only n-bits might be insufficient as information required for self-diagnosis. Accordingly, the number of bits for which the comparison results are required to be obtained may be predetermined, and the diagnostic processing unit 108 may make a self-diagnosis based on the comparison results for a required number of bits. Note that in the case where there are consecutive mismatches between the sampling results and the known parallel data, the diagnostic processing unit 108 may determine the transmission device 100 as malfunctioning, before obtaining the comparison results for n bits. In any case, the determination condition in the diagnostic processing unit 108 is predetermined, and is not intended to limit the present invention.

Hereinafter, the operation of the transmission device 100 will be described concretely with respect to the case where n=10. The diagnostic parallel data used in the case where n=10 include "1111100000", "0111110000", "0011111000", "0001111100", "0000111110", "0000011111", "1000001111", "1100000111", "1110000011," and "1111000001". As such, the rising edge of the diagnostic parallel data is sequentially delayed by one bit. Therefore, the clock signal generation serializer can output the n-bit serial data, while shifting its rising edge (or falling edge) by one bit, so that the rising edge (or falling edge) of the clock signal is sequentially shifted by 1 UI. Hereinafter, the diagnostic parallel data is expressed by "a1 a2 a3 a4 a5 a6 a7 a8 a9 a10."Note that for ease of explanation, the frequency of the clock signal TxC has been described herein as the same as that of the transmission data, but this is not restrictive. In the case where the frequency of the clock signal TxC is not the same as that of the transmission data, the diagnostic parallel data may be suitably designed, such that the rising edge (or falling edge) of the clock signal is sequentially shifted by 1 UI in accordance with the frequency of the clock signal TxC. Specifically, the designing can be readily achieved, and for example, the number of bits in the diagnostic parallel data that are to be shifted may be determined in accordance with the frequency of the clock signal TxC.

Figure 2:
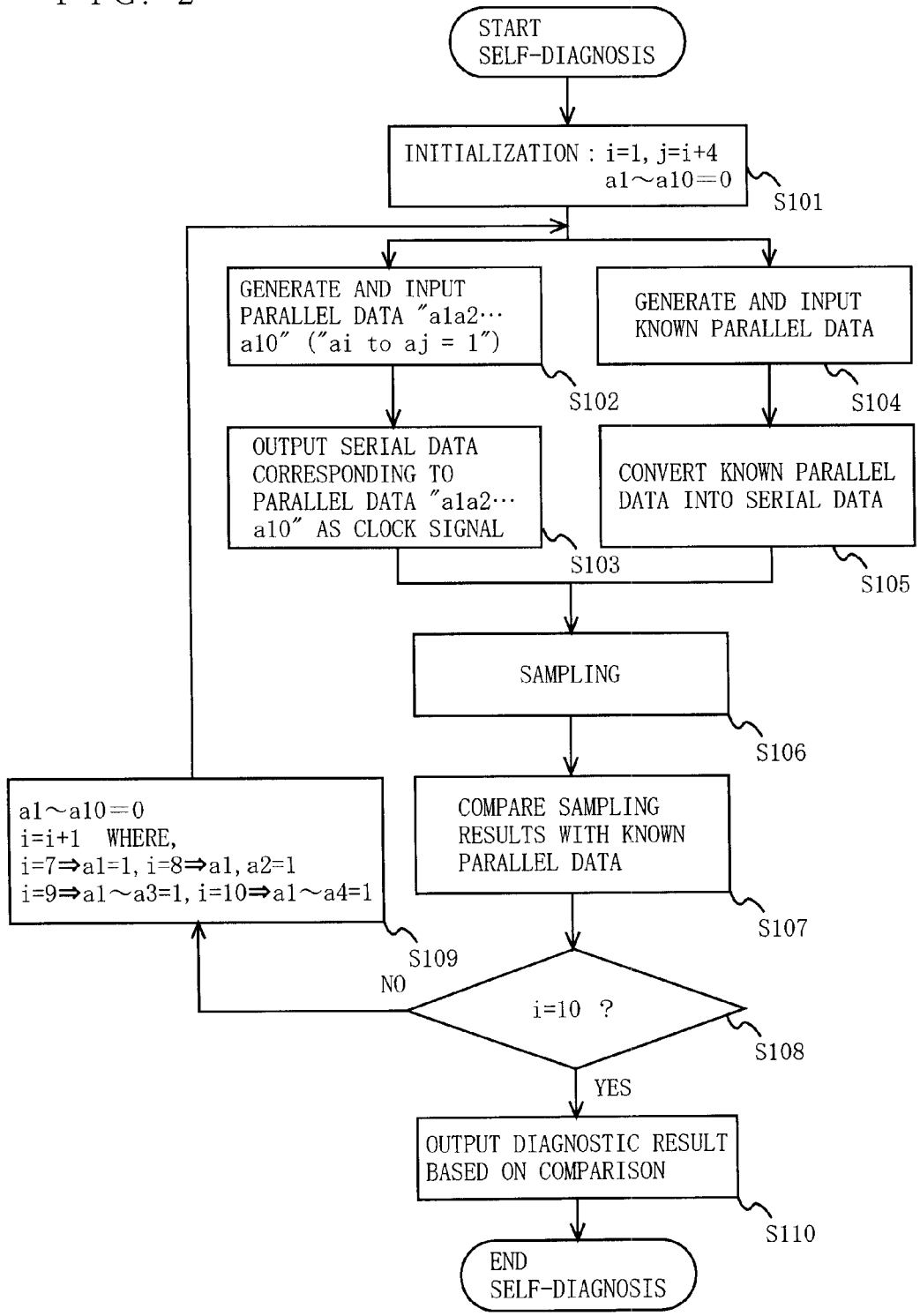
FIG. 2 is a flowchart illustrating the operation of the transmission device 100 in the case where n=10.

FIG. 2 is a flowchart illustrating the operation of the transmission device 100 in the case where n=10. When the self-diagnosis starts, the clock shift unit 105 configures settings such that i=1 and j=i+4, and sets the values of a1 to a10 to "0" (step S101).

Next, after setting the values of ai to aj to "1", the clock shift unit 105 generates the diagnostic parallel data "a1 a2 a3 a4 a5 a6 a7 a8 a9 a10, "and inputs the generated data to the clock signal generation serializer 104a (step S102). Then, the clock signal generation serializer 104a converts the inputted diagnostic parallel data into serial data. As a result, the serial data corresponding to the diagnostic parallel data is outputted from the clock signal transmission unit 104 as a clock signal TxC (step S103).

The activation control unit 106 causes the operations of steps S104 and S105 to be performed simultaneously, in synchronization with the operations of steps S102 and S103.

The known-parallel data generation unit 107 generates known parallel data and inputs it to the first through third parallel/serial conversion units 101, 102, and 103 (step S104). The first through third parallel/serial conversion units 101, 102, and 103 convert the inputted known parallel data into serial data, and output the resultant data (step S105).

After the operations of steps S103 and S105, the DFFs 109a, 109b, and 109c respectively sample the outputs from the first through third parallel/serial conversion unit 101, 102, and 103 at the rising edge (or falling edge) of the clock signal TxC, and input sampling results to the diagnostic processing unit 108 (step S106). The diagnostic processing unit 108 compares the sampling results with the known parallel data, and stores comparison results (step S107).

Next, the activation control unit 106 determines whether i=10, and if i is not equal to 10, the activation control unit 106 causes the clock shift unit 105 to perform the operation of step S109. The operation of step S109 generates diagnostic parallel data in the order: "0111110000", "0011111000", "0001111100", "0000111110", "0000011111", "1000001111", "1100000111", "1110000011", and "1111000001". After step S109, control returns to the operations of steps S102 and S104. By repeating the above-described operations, the diagnostic processing unit 108 can obtain comparison results for ten bits. Note that in order to obtain a plurality of sets of comparison results for ten bits at step S108, the operations starting from step S101 may be repeated a plurality of times. Conversely, if the comparison results obtained at step S107 clearly indicate that the transmission device 100 is malfunctioning, the transmission device 100 may output a diagnostic result without obtaining the comparison results for ten bits.

After step S108, the diagnostic processing unit 108 outputs a diagnostic result (normal or not) based on the comparison results (step S110), thereby completing the self-diagnosis.

Figure 3:
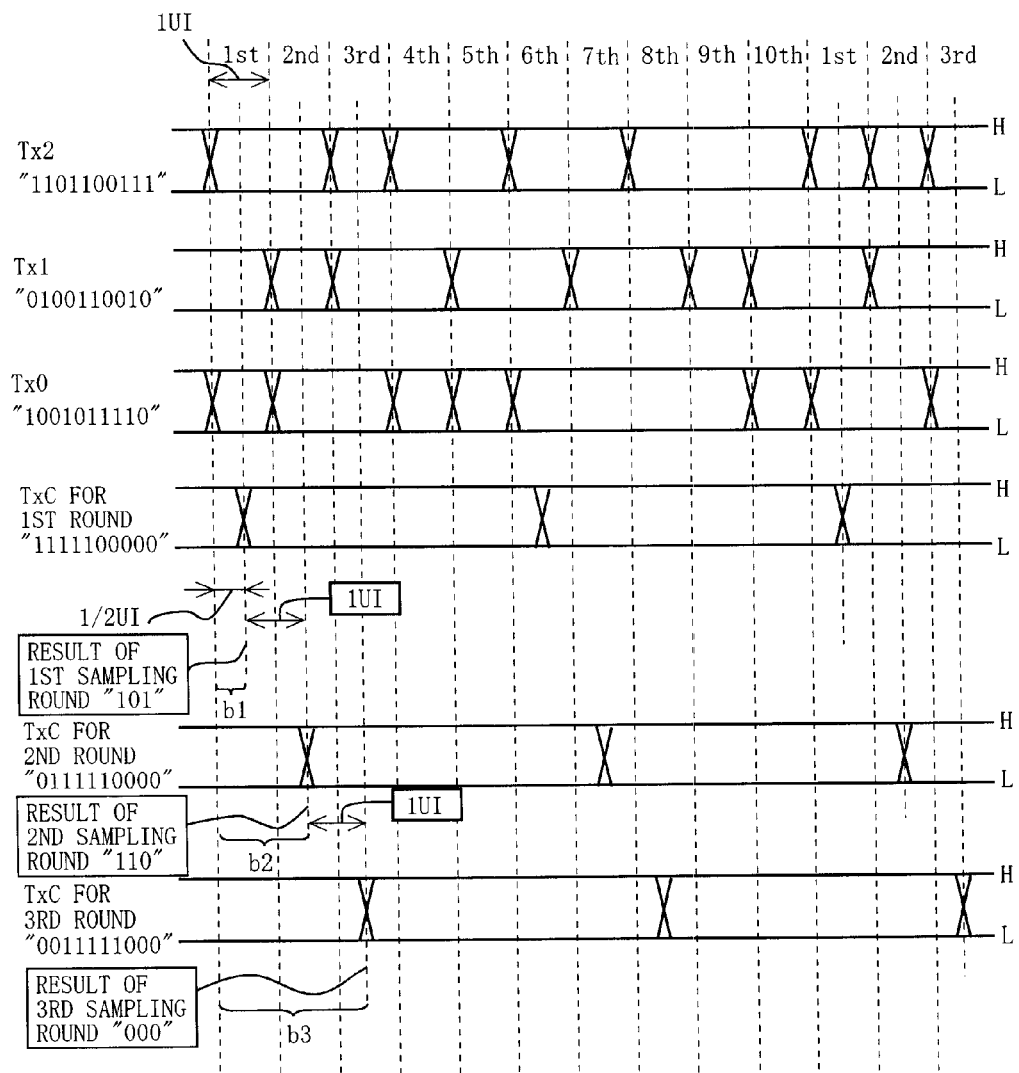
FIG. 3 is a diagram concretely illustrates an exemplary timing chart of self-diagnosis in the case where n=10.

FIG. 3 is a diagram concretely illustrating an exemplary timing chart of self-diagnosis in the case where n=10. In FIG. 3, it is assumed that the known parallel data inputted to the first parallel/serial conversion unit 101 is "1001011110", the known parallel data inputted to the second parallel/serial conversion unit 102 is "0100110010, "and the known parallel data inputted to the third parallel/serial conversion unit 103 is "1101100111". Note that the known parallel data for the first to tenth bits is shown here, but a known bit string for subsequent ten bits may be used as the known parallel data for self-diagnosis.

As shown in FIG. 3, in preferred embodiments, the rising edge (or falling edge) of the clock signal is shifted by ½ UI with respect to the rising edge (or falling edge) of the data signal. Accordingly, each DFF can perform sampling with the data signal being held stable, and therefore it can be expected that the data signal is detected with high accuracy.

For example, there are three conceivable methods as described below for shifting the rising edge (or falling edge) of the clock signal by ½ UI with respect to the rising edge (or falling edge) of the data signal. The first method is to cause a delay by using wiring conductors from the receiver 111d to the DFFs 109a, 109b, and 109c. In the case of the first method, the shift might not be precisely ½ UI, but it is possible to meet the temporal requirements for setting up the DFFs 109a, 109b, and 109c, and therefore it can be expected that the data signal is detected with high accuracy. The second method is to cause a delay of ½ UI, for example, by providing three stages of inverters in a voltage-controlled oscillator (VCO) within the TxPLL 110. The third method is to cause a delay of ½ UI, for example, by providing a delay-locked loop (DLL) downstream from the TxPLL 110 or the clock signal generation serializer 104a. Note that each method described here is merely an example of achieving the shift of ½ UI, and is not intended to limit the present invention. Any method capable of achieving the shift of ½ UI is applicable to the present invention.

Note that if the clock signal rises at a point where the data signal can be stably sampled, the predetermined amount by which to shift the rising edge (or falling edge) of the clock signal with respect to the rising edge (or falling edge) of the data signal does not have to be precisely ½ UI.

As shown in FIG. 3, the clock signal is shifted by 1 UI in the first and second rounds of sampling. Similarly, in subsequent rounds, the clock signal shifted by 1 UI is outputted from the clock signal transmission unit 104.

The result of the first sampling round is "101", and matches the first bits "1", "0", and "1" of the known parallel data. The result of the second sampling round is "110", and matches the second bits "1", "1", and "0" of the known parallel data. The result of the third sampling round is "000", and matches the third bits "0", "0", and "0" of the known parallel data.

As such, the clock signal is shifted by 1 UI, so that the consistency with the known parallel data can be sequentially determined from the first bit of the transmission data. Accordingly, by repeating this operation at least up to the tenth bits, and using the comparison results, the diagnostic processing unit 108 can determine whether the transmission device 100 is operating normally. Note that there might be a case where the first ten bits happen to be normal, and therefore it might be better to further diagnose subsequent ten bits. The number of bits for which to obtain comparison results is predetermined. If any error is detected before reaching the tenth bit, the diagnostic processing unit 108 may naturally output a diagnostic result indicative of malfunctioning.

As described above, according to the first embodiment, the transmission device 100 can make a self-diagnosis as to whether the known parallel data has been subjected to serial/parallel conversion successfully, while shifting the clock signal by 1 UI. The clock signal is an essential signal that is to be transmitted to the reception device. The component called "serializer (clock signal generation serializer)" for shifting the clock signal by 1 UI is essential to the transmission device. In addition, the receivers 111a, 111b, 111c, and 111d and the DFFs 109a, 109b, and 109c are general blocks. Accordingly, by inputting the diagnostic parallel data to the clock signal generation serializer at appropriate time, it becomes possible to make a self-diagnosis, making it possible to diagnose the performance of the transmission device at extremely low cost compared to the conventional case of using an expensive high-speed tester.

Second Embodiment

Figure 4:
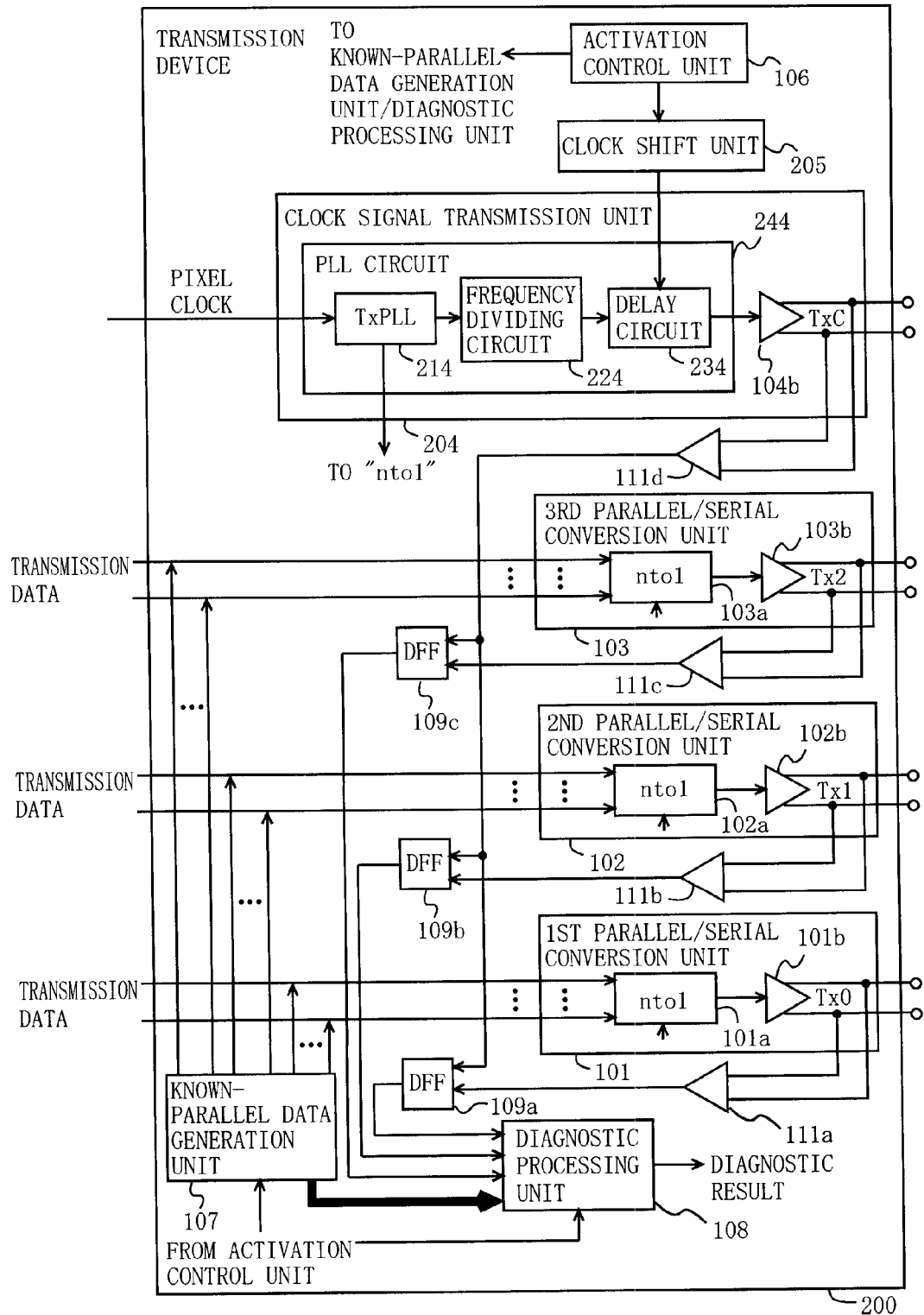
FIG. 4 is a block diagram illustrating the functional configuration of a transmission device 200 according to a second embodiment of the present invention.

FIG. 4 is a block diagram illustrating the functional configuration of a transmission device 200 according to a second embodiment of the present invention. In FIG. 4, elements having similar functions to those in the first embodiment are denoted by the same reference numerals, and the descriptions thereof will be omitted. The second embodiment differs from the first embodiment in terms of the configuration for shifting the clock signal by 1 UI.

In FIG. 4, the clock signal transmission unit 204 includes a PLL circuit 244, and a differential output circuit 104b. The PLL circuit 244 includes a TxPLL 214, a frequency dividing circuit 224, and a delay circuit 234. The TxPLL 214 increases the frequency of the pixel clock n-fold. The frequency dividing circuit 224 reduces the frequency of the output from the TxPLL 214 to 1/n. The delay circuit 234 delays the output of the frequency dividing circuit 224 under the control of the clock shift unit 205. When instructed by the activation control unit 106 to start the self-diagnosis, the clock shift unit 205 controls the delay circuit 234, such that the clock signal TxC is sequentially shifted by 1 UI. In the case where no self-diagnosis is performed, the clock shift unit 205 does not cause any delay by the delay circuit 234.

Figure 5:
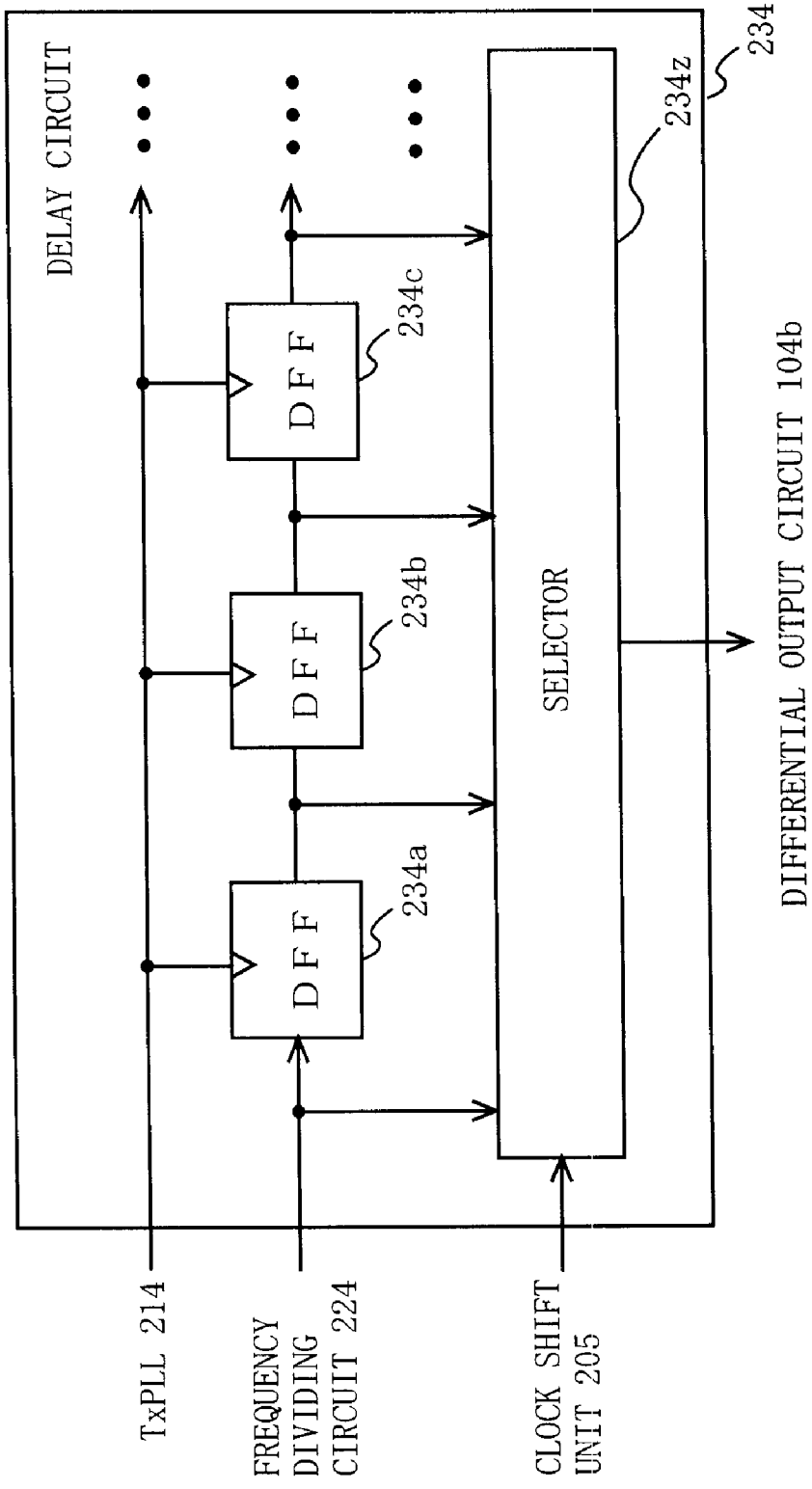
FIG. 5 is a block diagram illustrating an exemplary configuration of a delay circuit 234.

FIG. 5 is a block diagram illustrating an exemplary configuration of the delay circuit 234. As shown in FIG. 5, the delay circuit 234 is connected to, for example, a series of DFFs 234a, 234b, 234c, and so on, which operate in accordance with a clock from the TxPLL 214. Thus, clocks shifted by 1 UI are inputted to a selector 234z. Note that the output of the frequency dividing circuit 224 is also inputted to the selector 234z without any modification, and therefore a clock not delayed by 1 UI is also inputted to the selector 234z. The selector 234z is capable of outputting the clock not delayed by 1 UI, or selecting and outputting the clocks that are shifted by 1 UI, under the control of the clock shift unit 205. Therefore, it is possible to obtain the clock signal TxC that is sequentially shifted by 1 UI. Note that the delay circuit 234 does not have to be configured as shown in FIG. 5, and any configuration may be employed so long as the delay circuit 234 can control the shift of 1 UI.

Figure 6:
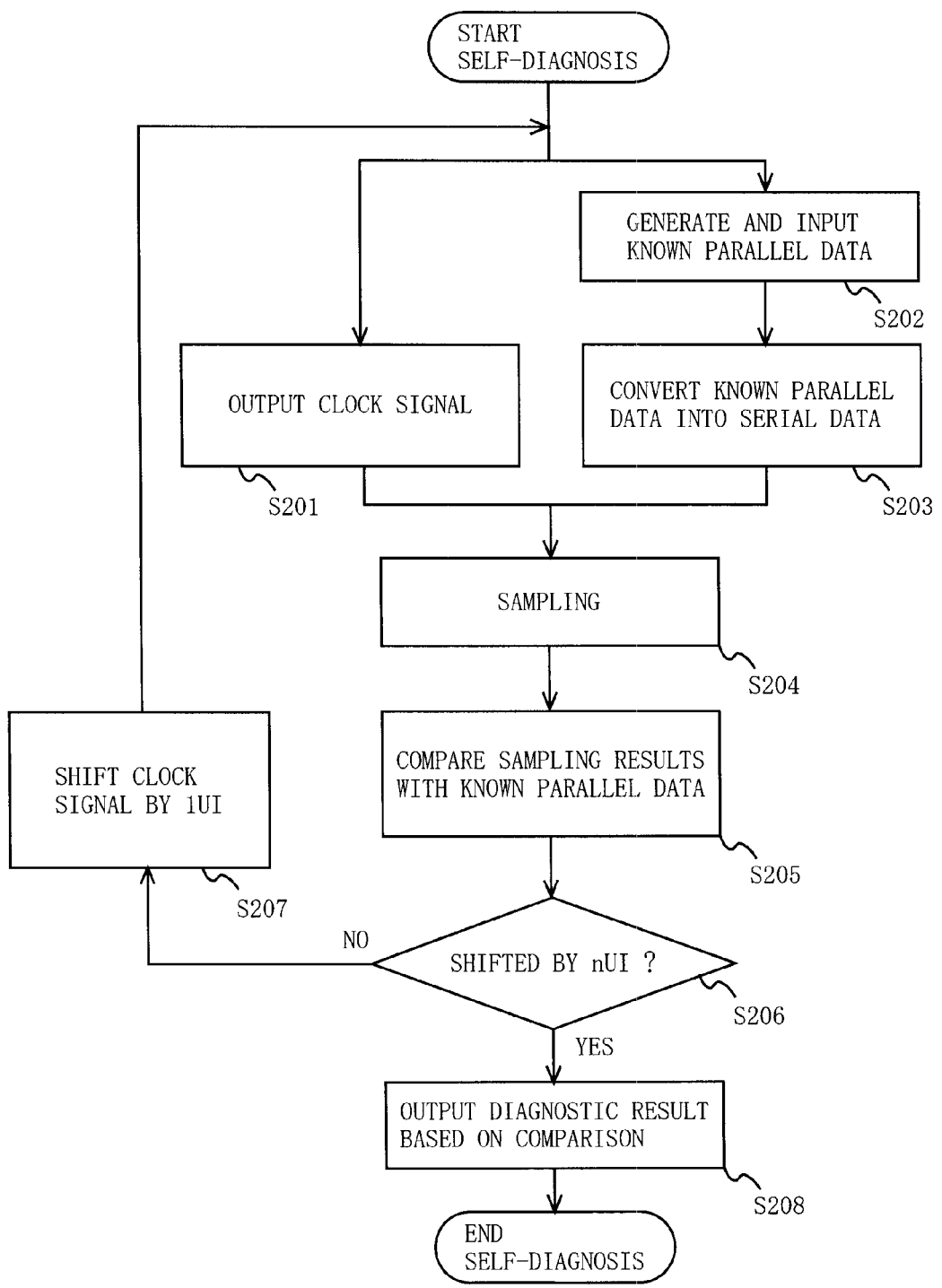
FIG. 6 is a flowchart illustrating the operation of the transmission device 200 according to the second embodiment.

FIG. 6 is a flowchart illustrating the operation of the transmission device 200 according to the second embodiment. Referring to FIG. 6, the operation of the transmission device 200 according to the second embodiment will be described below.

When the self-diagnosis starts, the clock signal transmission unit 204 outputs a clock signal TxC (step S201). In parallel with the operation of step S201, the known-parallel data generation unit 107 generates known parallel data, and inputs it to the first through third parallel/serial conversion units 101, 102, and 103 (step S202). The first through third parallel/serial conversion units 101, 102, and 103 convert the inputted known parallel data to serial data, and output the resultant data (step S203). Thereafter, the DFFs 109a, 109b, and 109c sample their respective outputs of the first through third parallel/serial conversion units 101, 102, and 103 (step S204). Then, the diagnostic processing unit 108 compares sampling results with the known parallel data, and stores comparison results (step S205).

Next, the clock shift unit 205 determines whether the clock signal TxC has been shifted by n UI (step S206). If the clock signal has not been shifted by n UI, the clock shift unit 205 controls the delay circuit 234 to shift the clock signal TxC by 1 UI (step S207). Note that as in the first embodiment, the clock shift unit 205 may control the delay circuit 234 to shift the clock signal TxC by 1 UI, after shifting the clock signal by ½ UI with respect to the rising edge (or falling edge) of the data signal. Thereafter, the operations from step S201 onward will be repeated until the clock signal is shifted by n UI.

After the clock signal TxC is shifted by n UI, the diagnostic processing unit 108 outputs a diagnostic result based on the comparison results. Note that as in the first embodiment, the process of shifting the clock signal TxC by n UI may be repeated a plurality of times before the diagnostic processing unit 108 outputs the diagnostic result. In addition, if the transmission device 200 is determined as malfunctioning before completing the shift of n UI, the transmission device 200 may output a diagnostic result indicative of malfunctioning at that time.

In this manner, the second embodiment also makes it possible to provide a transmission device capable of making a self-diagnosis without using any expensive high-speed tester, and also provide an electronic apparatus provided with the same transmission device.

As can be appreciated from the first and second embodiments, in the present invention, it is important that the comparison with the known parallel data is carried out by shifting the clock signal TxC by 1 UI. Accordingly, the configuration for shifting the clock signal TxC is not limited to those disclosed in the first and second embodiments.

Third Embodiment

In a third embodiment of the present invention, the transmission device is configured similarly to those in the first and second embodiments, and therefore FIG. 1 or 4 will be referenced. In the first and second embodiments, the clock signal TxC is shifted by 1 UI, but in the third embodiment, the clock signal TxC is continuously or gradually shifted by 1 UI within a predetermined period (e.g., a period in which jitter tends to occur, such as a period in which the data signal rises or falls).

Figure 7:
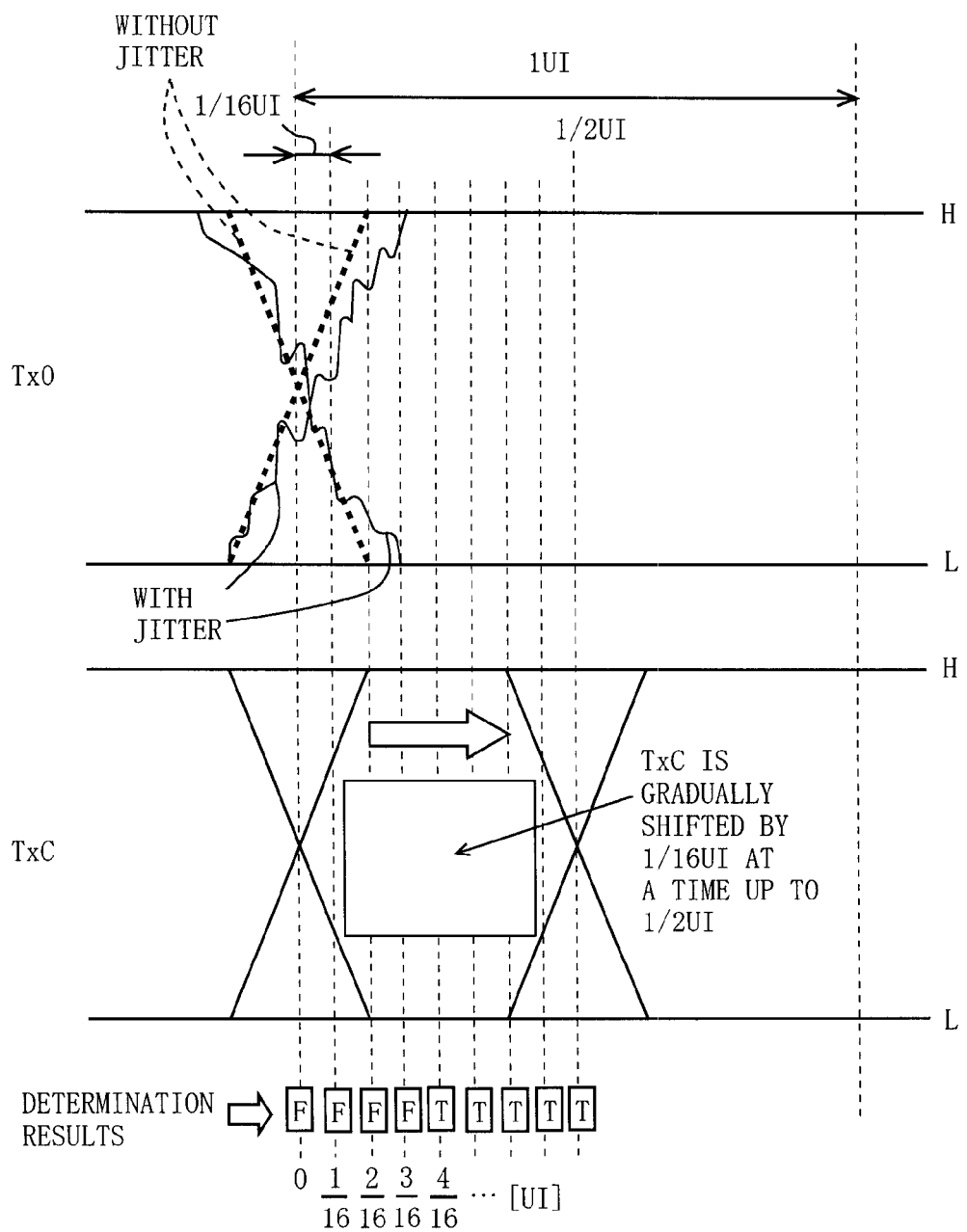
FIG. 7 is a schematic diagram for explaining the operation of a transmission device according to a third embodiment of the present invention.

FIG. 7 is a schematic diagram for explaining the operation of the transmission device according to the third embodiment. The transmission data (here, Tx0 is taken as an example) has jitter at its rising edge (or falling edge). In the absence of jitter (indicated by bold doted lines in the figure), the transmission device can ideally make a self-diagnosis. However, in the presence of jitter (indicated by thin lines on the figure), even if the sampling results are consistent with the known parallel data at a time point corresponding to the shift of ½ UI, the jitter is significant, and therefore the transmission device can be a defective product.

Accordingly, in the example shown in FIG. 7, the clock signal TxC is shifted by ⅟₁₆ UI during the period from 0 UI to ½ UI, in order to compare the sampling results with the known parallel data. In the example shown in FIG. 7, the determination results for the period from 0 UI to ³⁄₁₆ UI are "error" (denoted by "F" in the figure). On the other hand, the determination results for the period from ⁴⁄₁₆UI to ½ UI are "normal" (denoted by "T" in the figure). In this manner, the diagnostic processing unit 108 can measure the jitter in the data signals by comparing the sampling results with the known parallel data. Note that the clock signal has been described here as being gradually shifted by ⅟₁₆ UI during the period from 0 UI to ½ UI, but the intervals at which to gradually shift the clock signal TxC are not limited to ⅟₁₆ UI. The clock signal TxC may be continuously shifted. In addition, the predetermined period in which to gradually or continuously shift the clock signal TxC is not limited to the period from 0 UI to ½ UI, any period may be chosen.

Figure 8:
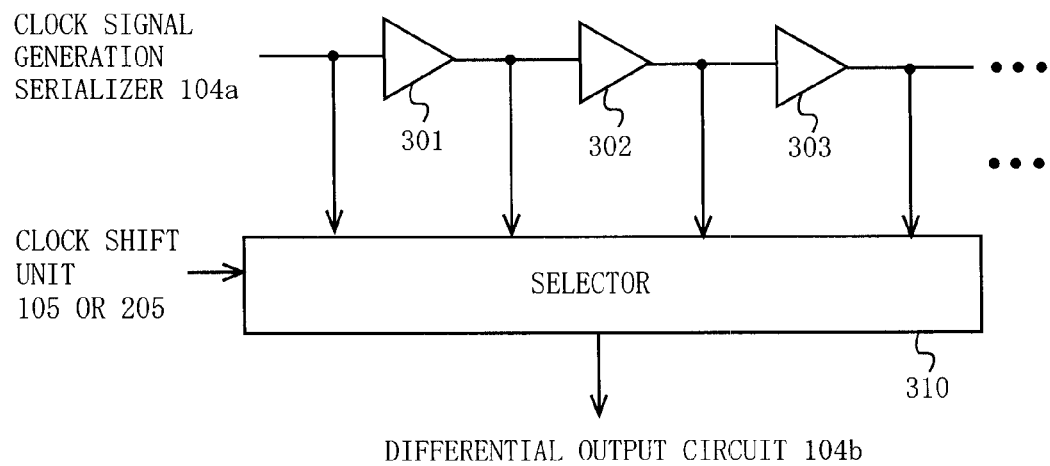
FIG. 8 is a diagram illustrating an exemplary configuration for gradually or continuously shifting a clock signal TxC.

For example, there are two conceivable methods as described below for gradually or continuously shifting the clock signal TxC. The first method is to, as shown in FIG. 8, connect a plurality of delay elements 301, 302, 303, and so on downstream from the clock signal generation serializer 104a, and connect the output of each delay element to the selector 310. In this method, the selector 310 sequentially selects and outputs each delay element's input under the control of the clock shift unit 105 or 205, thereby gradually or continuously shifting the clock signal TxC. The second method is to increase/decrease the voltage that is to be applied to the VCO in the TxPLL 110, thereby gradually or continuously shifting the clock signal TxC. Note that the method for gradually or continuously shifting the clock signal TxC is not limited to the above methods.

Figure 9:
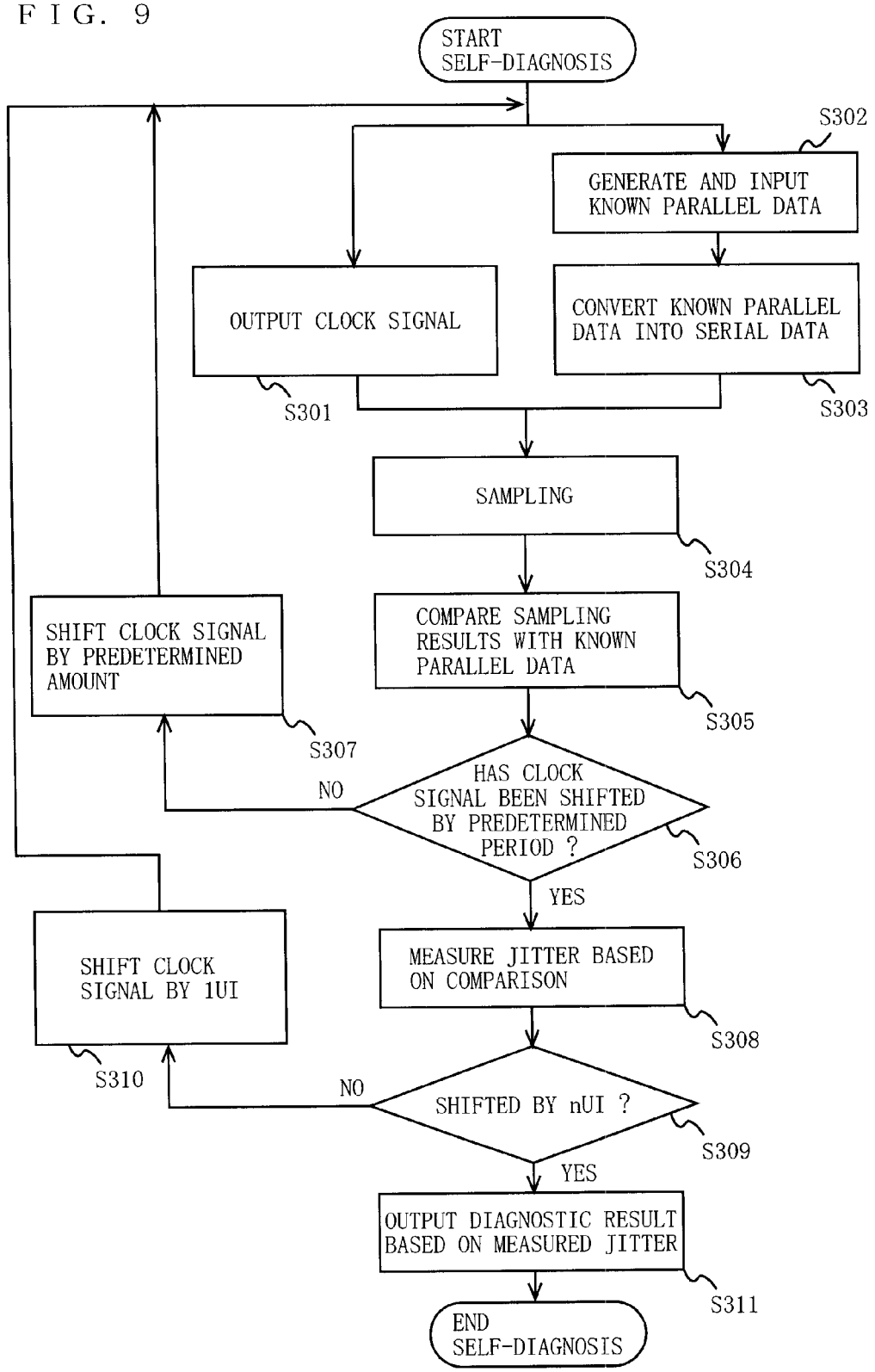
FIG. 9 is a flowchart illustrating the operation of the transmission device according to the third embodiment.

FIG. 9 is a flowchart illustrating the operation of the transmission device according to the third embodiment. Referring to FIG. 9, the operation of the transmission device according to the third embodiment will be described below.

When the self-diagnosis starts, the clock signal is outputted (step S301), known parallel data is generated and inputted (step S302), and the known parallel data is converted into serial data (step S303). Thereafter, sampling is performed (step S304), so that sampling results are compared with the known parallel data and the comparison results are stored (step S305).

Then, the clock shift unit 105 determines whether the clock signal TxC has been shifted by a predetermined period (in the example of FIG. 7, the period from 0 UI to ½ UI) (step S306). If the clock signal has not been shifted by that period, the clock shift unit 105 shifts the clock signal by a predetermined amount (in the example of FIG. 7, ⅟₁₆ UI) (step S307), and control returns to operations of steps S301 and S302. The transmission device repeats the operations from steps S301 to S307 until the clock signal TxC is shifted by the predetermined period.

If the clock signal TxC is determined at step S306 to have been shifted by the predetermined period, the diagnostic processing unit 108 measures jitter based on the comparison results, and stores a measurement result (step S308). Then, the clock shift unit 105 determines whether the clock signal TxC has been shifted by n UI (step S309). If the clock signal TxC has not been shifted by n UI, the clock shift unit 105 shifts the clock signal TxC by 1 UI from the point from which the gradual or continuous shift is to be started (step S310), and control returns to the operations of steps S301 and S302. At step S310, the clock shift unit 105 shifts the clock signal by 1 UI from 0 UI as shown in the example of FIG. 7. In the third embodiment, the clock signal TxC is gradually or continuously shifted during the predetermined period, but as is apparent from the operation of step S310, the operation of shifting the clock signal by 1 UI is included as in the first and second embodiments.

When the clock signal TxC has been determined at step S309 to have been shifted by n UI, the diagnostic processing unit 108 outputs a self-diagnosis result based on the measured jitter (step S311), thereby completing the self-diagnosis. For example, when the jitter does not meet a predetermined requirement, the diagnostic processing unit 108 determines that the transmission device is malfunctioning. For example, the predetermined condition in the example of FIG. 7 may be such that if "F" occurs at 2/16 UI or later, the transmission device is determined as malfunctioning. The predetermined condition may be suitably determined to accord with the standard, and is not particularly limited.

As such, in the third embodiment, by gradually or continuously shifting the clock signal TxC, it becomes possible to measure jitter in the data signals that occurs in the transmission device, and determine whether the transmission device is malfunctioning or not based on the measured jitter. Accordingly, compared to the first and second embodiments, the third embodiment is useful as a self-diagnostic method for transmission devices that are required to have higher performance.

Fourth Embodiment

Figure 10:
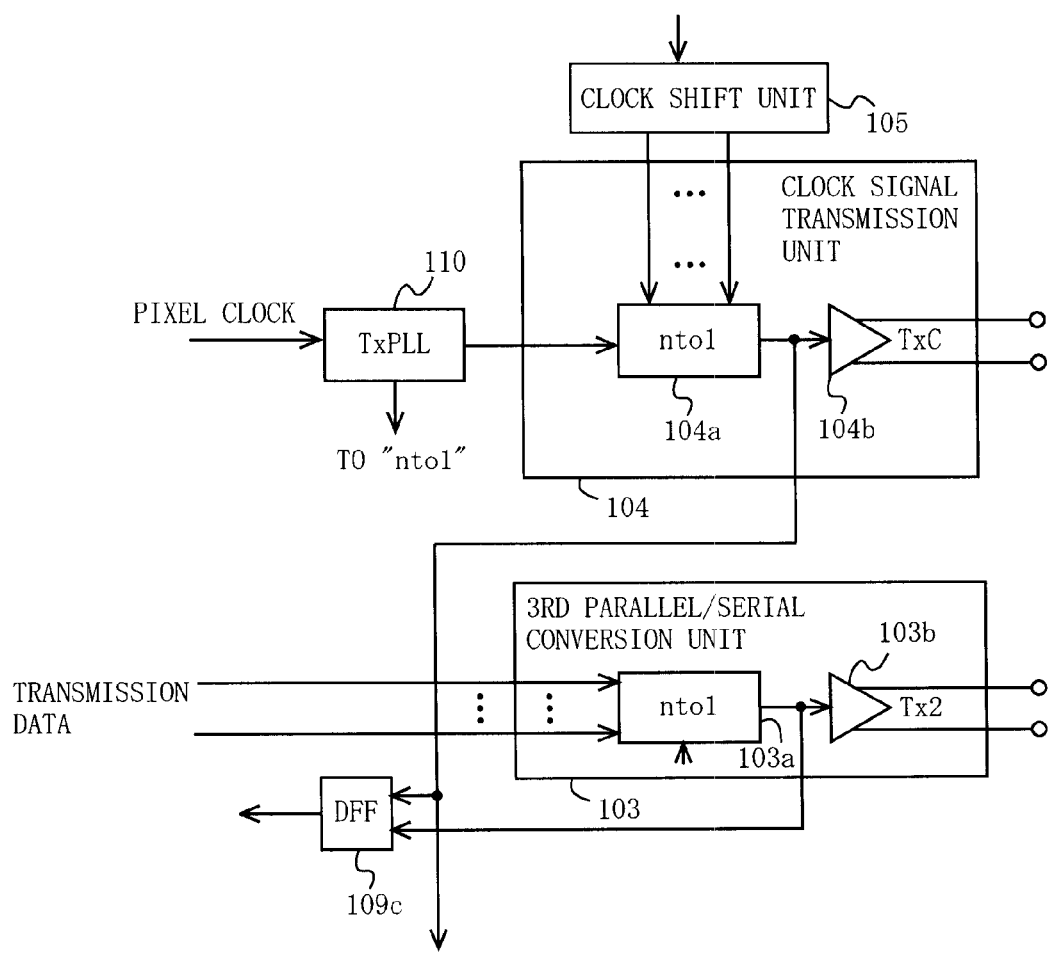
FIG. 10 is a block diagram illustrating, in part, the configuration of a transmission device according to a fourth embodiment of the present invention.

FIG. 10 is a block diagram illustrating, in part, the configuration of a transmission device according to a fourth embodiment of the present invention. In FIG. 10, elements having similar functions to those of the transmission device according to the first embodiment are denoted by the same reference numerals, and the descriptions thereof will be omitted. While FIG. 10 shows only the TxPLL 110, the DFF 109c, the clock shift unit 105, the clock signal transmission unit 104, and the third parallel/serial conversion unit 103, other elements are also modified in a manner as described below.

In the fourth embodiment, data outputted from the clock signal generation serializer 104a is inputted to the DFF 109c. In addition, data outputted from the parallel/serial conversion unit 103a is inputted to the DFF 109c. The same is applied to the parallel/serial conversion units 101a and 102a. As such, in the fourth embodiment, sampling is performed in accordance with a clock signal and data signals before the clock signal and the data signals are converted into differential signals. The diagnostic processing unit 108 can make a self-diagnosis as in the first embodiment, based on sampling results even if the sampling results are obtained before the clock signal and the data signals are converted into the differential signals. Thus, the necessity of the receivers 111a, 111b, 111c, and 111d is eliminated, making it possible to provide a transmission device and an electronic apparatus according to the present invention at low cost.

Fifth Embodiment

Figure 11:
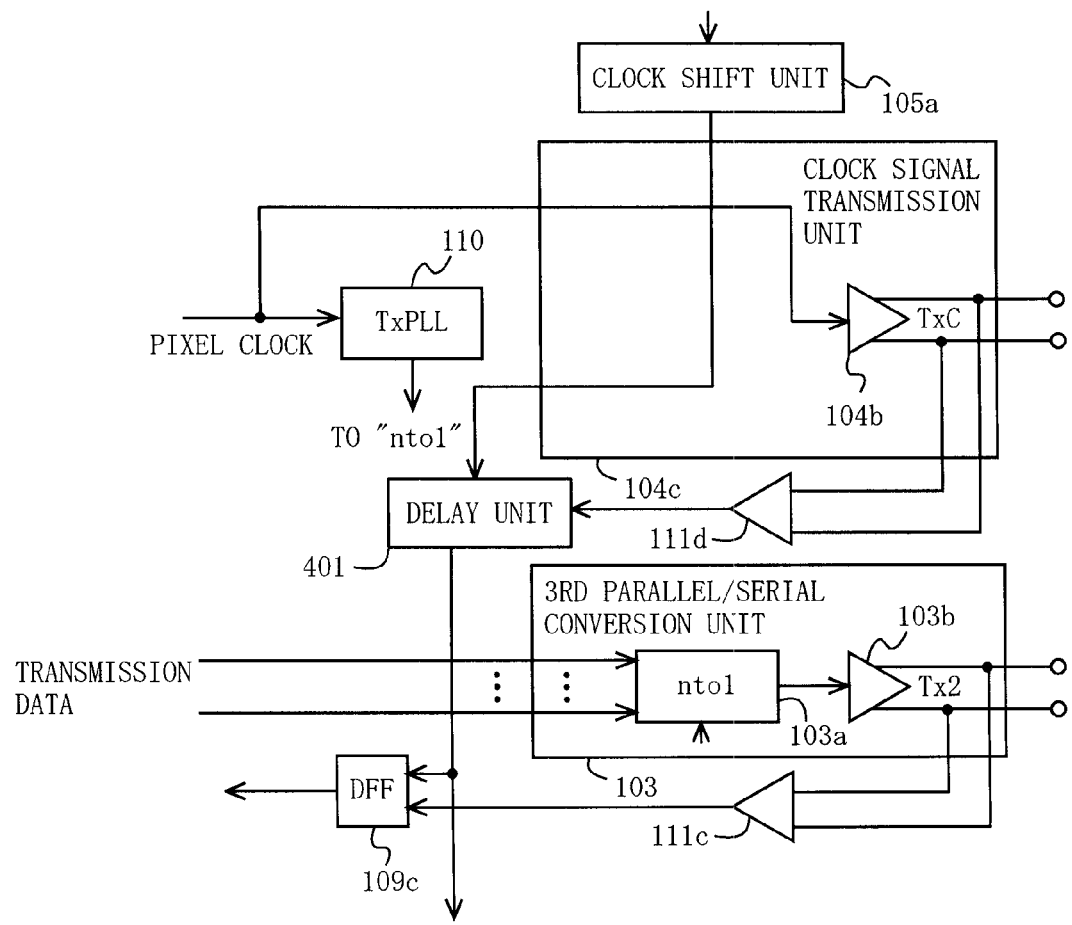
FIG. 11 is a block diagram illustrating, in part, the configuration of a transmission device according to a fifth embodiment of the present invention.

FIG. 11 is a block diagram illustrating, in part, the configuration of a transmission device according to a fifth embodiment of the present invention. In FIG. 11, elements having similar functions to those of the transmission device according to the first embodiment are denoted by the same reference numerals, and the descriptions thereof will be omitted. Note that elements not shown in FIG. 11 are configured in the same manner as their counterparts in the first embodiment.

In the fifth embodiment, unlike in the first embodiment, the clock signal generation serializer 104a is not used. A pixel clock is inputted to the differential output circuit 104b, which converts the pixel clock into a differential signal and outputs the differential signal as a clock signal TxC. The differential signal TxC is converted into a single-phase signal by the receiver 111d. The clock shift unit 105a causes a delay unit 401 to sequentially shift the clock signal TxC, i.e., the single-phase signal, by 1 UI. For example, the delay unit 401 can be configured as shown in FIG. 5. The clock signal TxC outputted from the delay unit 401 is inputted to each of the DFFs 109a, 109b, and 109c. As a result, sampling is performed in accordance with the clock signal TxC while shifting the clock signal TxC by 1 UI as in the first embodiment. Thus, the self-diagnosis is also made possible in the fifth embodiment.

Note that, as in the case of the fourth embodiment, the configuration according to the fifth embodiment can be modified to eliminate the necessity of the receivers 111a, 111b, 111c, and 111d. In addition, the configuration according to the fifth embodiment can be modified into the configurations as described in the first to third embodiments.

Sixth Embodiment

Figure 12:
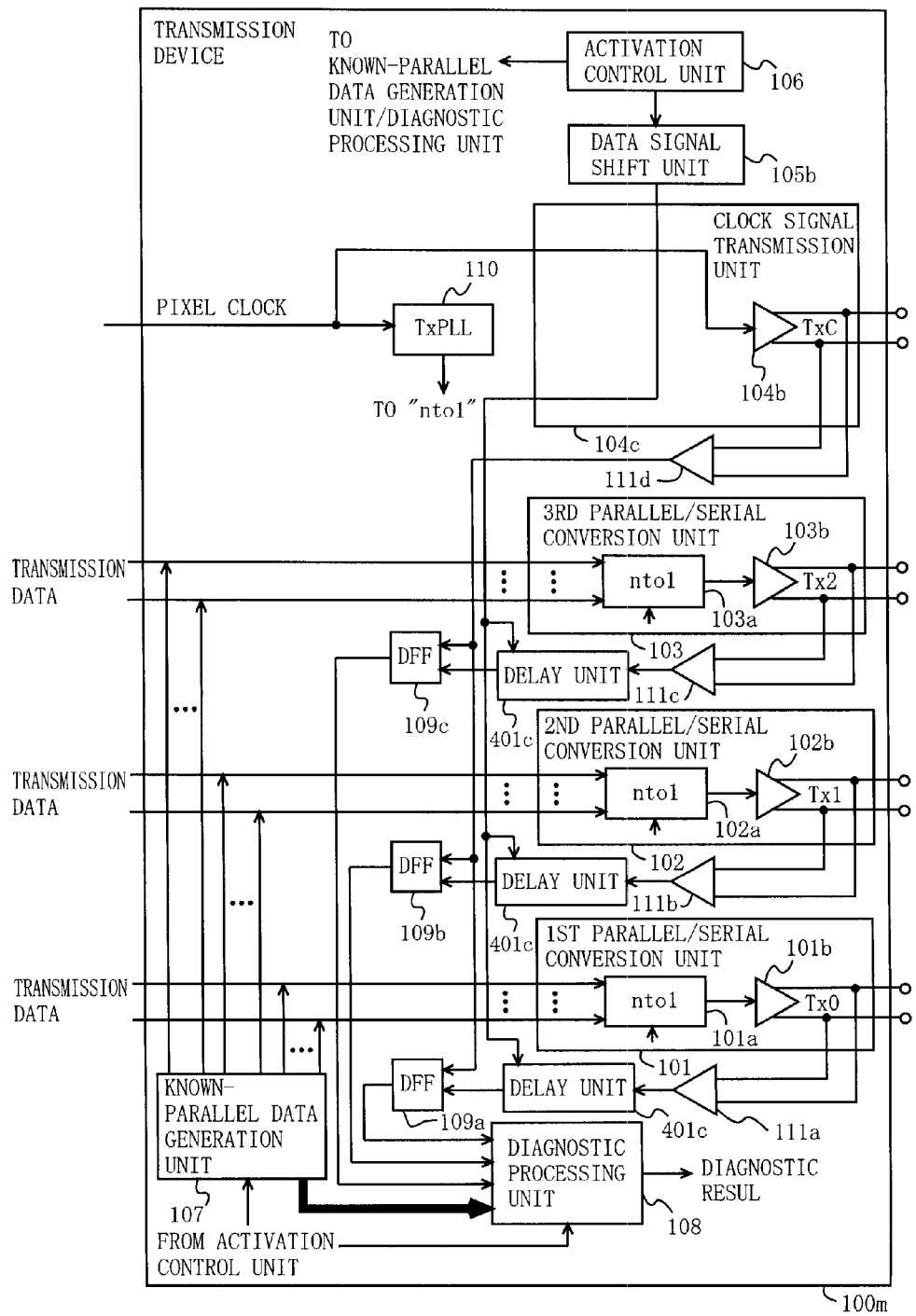
FIG. 12 is a block diagram illustrating the configuration of a transmission device 100m according to a sixth embodiment of the present invention.

FIG. 12 is a block diagram illustrating the configuration of a transmission device 100m according to a sixth embodiment of the present invention. In FIG. 12, elements having similar functions to those of the transmission device according to the first embodiment are denoted by the same reference numerals, and the descriptions thereof will be omitted.

In the sixth embodiment, a data signal shift unit 105b is used in place of the clock shift unit 105a in the fifth embodiment. When making a self-diagnosis, the data signal shift unit 105b causes each delay unit 401c to sequentially shift a data signal, which is obtained by serializing known parallel data, by 1 UI of the data signal. The DFFs 109a, 109b, and 109c sample the data signal obtained from the known parallel data and shifted by 1 UI, in accordance with the clock signal TxC. As a result, the rising edge (falling edge) of the clock signal is sequentially shifted by 1 UI of the data signal with respect to the rising edge (falling edge) of the data signal. Thus, as in the other embodiments, the transmission device 100m can make a self-diagnosis.

Note that in the sixth embodiment, the clock signal generation serializer as described in the first embodiment may be used to generate the clock signal TxC. In addition, the sixth embodiment may be modified as described in the second to fifth embodiments. For example, the data signal shift unit 105b may cause the delay unit 401c to continuously or gradually shift the data signal by a predetermined period, so that jitter can be measured. In such a case, if the jitter does not meet a predetermined requirement, the diagnostic processing unit 108 may determine that the transmission device is malfunctioning. In addition, the data signal shift unit 105b may cause the delay unit 401c to sequentially shift the data signal, which is obtained by serializing the known parallel data, by 1 UI, such that the rising or falling edge of the data signal is shifted by ½ UI with respect to the rising or falling edge of the clock signal.

As is apparent from the sixth embodiment, as well as the first to fifth embodiments, in order to implement the present invention, the temporal difference between the start of the data signal, which is obtained by serializing the known parallel data, and the rising edge (falling edge) of the clock signal (e.g., the temporal differences b1, b2, b3, etc., in FIG. 3) is controlled to be sequentially shifted by 1 UI of the data signal. That is, the clock shift units in the first to fifth embodiments and the data signal shift unit in the sixth embodiment function as shift units for sequentially shifting the temporal difference (time lag) between the clock signal and the data signal, which is obtained by serializing the known parallel, by 1 UI of the data signal. The DFFs acting as sampling units sample the data signal, which is obtained by serializing the known parallel data, in accordance with their respective temporally different clock signals.

The transmission device, electronic apparatus and method of the present invention enable the self-diagnosis, and are advantageous in the fields of, for example, electronic apparatuses, semiconductor devices, and communication devices.

While the invention has been described in detail, the foregoing description is in all aspects illustrative and not restrictive. It is understood that numerous other modifications and variations can be devised without departing from the scope of the invention.

What is claimed is:

1. A transmission device for transmitting data signals and a clock signal in one direction to a reception device, the clock signal being used for reproducing the data signals on the reception device side, the transmission device comprising:
   one or more parallel/serial conversion units for converting one or more pieces of n-bit parallel data, where n is an integer of two or more, into one or more pieces of serial data, and transmitting the one or more pieces of serial data to the reception device as one or more data signals;
   a clock signal transmission unit for transmitting the clock signal to the reception device;
   a known-parallel data generation unit for generating known n-bit parallel data as known parallel data when the transmission device makes a self-diagnosis as to whether the transmission device is operating normally, and inputting the generated known parallel data into the one or more parallel/serial conversion units;
   a shift unit for, when the transmission device makes the self-diagnosis, sequentially shifting a temporal difference between the clock signal and a data signal by 1 UI of the data signal, the data signal being obtained by serializing the known parallel data;
   one or more sampling units for, when the transmission device makes the self-diagnosis, sampling the data signal obtained by serializing the known parallel data, in accordance with the clock signal temporally different from the data signal; and
   a diagnostic processing unit for making a diagnosis as to whether the transmission device is operating normally by comparing sampling results obtained by the one or more sampling units with the known parallel data generated by the known-parallel data generation unit, and outputting a result of the diagnosis.

2. The transmission device according to claim 1,
   wherein the shift unit is a clock shift unit for sequentially shifting the clock signal by 1 UI of the data signal, and
   wherein the one or more sampling units sample the data signal obtained by serializing the known parallel data, in accordance with the clock signal shifted by 1 UI by the clock shift unit.

3. The transmission device according to claim 2,
   wherein the clock signal transmission unit includes:
      a clock signal generation serializer for generating the clock signal by converting n-bit clock parallel data into serial data, the n-bit clock parallel data having the same frequency as that of the n-bit parallel data and transitioning from a high/low level to a low/high level after half the number of bits; and
      a transmission unit for transmitting the clock signal generated by the clock signal generation serializer to the reception device, and
   wherein the clock shift unit sequentially inputs n-bit diagnostic parallel data to the clock signal generation serializer, thereby sequentially shifting the clock signal outputted from the clock signal transmission unit by 1 UI of the data signal, the n-bit diagnostic parallel data being used for causing the clock signal generation serializer to output n-bit serial data while shifting its rising edge or falling edge by one bit.

4. The transmission device according to claim 2,
   wherein the clock signal transmission unit includes:
      a PLL circuit for generating the clock signal; and
      a transmission unit for transmitting the clock signal generated by the PLL circuit to the reception device, and
   wherein the clock shift unit sequentially delays the clock signal generated by the PLL circuit by 1 UI of the data signal.

5. The transmission device according to claim 2,
   wherein the clock shift unit causes the clock signal transmission unit to continuously or gradually shift a rising edge or falling edge of the clock signal by a predetermined period,
   wherein the one or more sampling units sample the data signal each time the clock signal is shifted; and
   wherein the diagnostic processing unit measures jitter by comparing sampling results obtained by the one or more sampling units with the known parallel data generated by the known-parallel data generation unit.

6. The transmission device according to claim 5, wherein the diagnostic processing unit determines the transmission device as malfunctioning when the jitter does not meet a predetermined requirement.

7. The transmission device according to claim 2, wherein the clock shift unit causes the clock signal transmission unit to sequentially shift the clock signal by 1 UI, such that a rising edge or falling edge of the clock signal is shifted by ½ UI with respect to a rising edge or falling edge of the data signal.

8. The transmission device according to claim 2, wherein the clock shift unit sequentially delays the clock signal to sequentially shift the clock signal by 1 UI.

9. The transmission device according to claim 1, further comprising an activation control unit for controlling activation of the known-parallel data generation unit, the shift unit, the one or more sampling units, and the diagnostic processing unit.

10. The transmission device according to claim 1,
    wherein the shift unit is a data signal shift unit for sequentially shifting the data signal obtained by serializing the known parallel data, by 1 UI of the data signal, and
    wherein the one or more sampling units sample the data signal shifted by 1 UI by the data signal shift unit, in accordance with the clock signal.

11. An electronic apparatus for transmitting data signals and a clock signal in one direction to a reception apparatus, thereby causing the reception apparatus to operate, the clock signal being used for reproducing the data signals on the reception apparatus side, the electronic apparatus comprising:
    one or more parallel/serial conversion units for converting one or more pieces of n-bit parallel data, where n is an integer of two or more, into one or more pieces of serial data, and transmitting the one or more pieces of serial data to the reception apparatus as one or more data signals;
    a clock signal transmission unit for transmitting the clock signal to the reception apparatus;
    a known-parallel data generation unit for generating known n-bit parallel data as known parallel data when the electronic apparatus makes a self-diagnosis as to whether the electronic apparatus is operating normally, and inputting the generated known parallel data into the one or more parallel/serial conversion units;

a shift unit for, when the electronic apparatus makes the self-diagnosis, sequentially shifting a temporal difference between the clock signal and a data signal by 1 UI of the data signal, the data signal being obtained by serializing the known parallel data;

one or more sampling units for, when the electronic apparatus makes the self-diagnosis, sampling the data signal obtained by serializing the known parallel data, in accordance with the clock signal temporally different from the data signal; and a diagnostic processing unit for making a diagnosis as to whether the electronic apparatus is operating normally by comparing sampling results obtained by the one or more sampling units with the known parallel data generated by the known-parallel data generation unit, and outputting a result of the diagnosis.

12. A method for allowing a transmission device to make a self-diagnosis as to whether the transmission device is operating normally, the transmission device transmitting data signals and a clock signal in one direction to a reception device, the clock signal being used for reproducing the data signals on the reception device side, wherein the transmission device includes:

one or more parallel/serial conversion units for converting one or more pieces of n-bit parallel data, where n is an integer of two or more, into one or more pieces of serial data, and transmitting the one or more pieces of serial data to the reception device as one or more data signals; and a clock signal transmission unit for transmitting the clock signal to the reception device, and wherein the method comprises the steps of:

generating known n-bit parallel data as known parallel data, and inputting the generated known parallel data into the one or more parallel/serial conversion units;

sequentially shifting a temporal difference between the clock signal and a data signal by 1 UI of the data signal, the data signal being obtained by serializing the known parallel data;

sampling the data signal obtained by serializing the known parallel data, in accordance with the clock signal temporally different from the data signal; and making a diagnosis as to whether the transmission device is operating normally by comparing sampling results with the known parallel data.

* * * * *